United States Patent
Hoeffgen et al.

(10) Patent No.: US 9,633,739 B2
(45) Date of Patent: Apr. 25, 2017

(54) METHOD OF ERASING INFORMATION AND DEVICE FOR PERFORMING SAME

(71) Applicant: Fraunhofer-Gesellschaft zur Foerderung der angewandten Forschung e.V., Munich (DE)

(72) Inventors: Stefan Hoeffgen, Pulheim (DE); Michael Joester, Euskirchen (DE); Jochen Kuhnhenn, Euskirchen (DE); Tobias Kuendgen, Wachtberg (DE); Stefan Metzger, Heimbach (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/001,054

(22) Filed: Jan. 19, 2016

(65) Prior Publication Data

US 2016/0133331 A1 May 12, 2016

Related U.S. Application Data

(63) Continuation of application No. PCT/EP2014/065393, filed on Jul. 17, 2014.

(30) Foreign Application Priority Data

Jul. 19, 2013 (DE) ...................... 10 2013 214 214

(51) Int. Cl.
*G11C 16/10* (2006.01)
*G11C 16/18* (2006.01)
(Continued)

(52) U.S. Cl.
CPC .......... *G11C 16/18* (2013.01); *G11C 11/5635* (2013.01); *G11C 16/0408* (2013.01); *G11C 16/0416* (2013.01); *G11C 16/16* (2013.01)

(58) Field of Classification Search
CPC ..................... G11C 16/0416; G11C 17/12
(Continued)

(56) References Cited

U.S. PATENT DOCUMENTS

| 4,393,479 A | 7/1983 | Du et al. |
| 4,933,898 A | 6/1990 | Gilberg et al. |

(Continued)

FOREIGN PATENT DOCUMENTS

| DE | 69034125 T2 | 11/2004 |
| EP | 0212520 A | 4/1987 |
| JP | S5975496 A | 4/1984 |

OTHER PUBLICATIONS

"Solid-state drive (Wikipedia)", Retrieved from http://de.wikipedia.org/wiki/Solid-State-Drive#Sicheres_L.C3.B6schen; Web page last modified on Feb. 5, 2016, 28 pages.

(Continued)

*Primary Examiner* — Son Mai
(74) *Attorney, Agent, or Firm* — Michael A. Glenn; Perkins Coie LLP

(57) ABSTRACT

Methods and devices for erasing information stored on an electronic semiconductor component in a plurality of non-volatile memory elements are described. Irradiating the semiconductor component with erasing radiation until a target dose has been absorbed by the semiconductor component, the erasing radiation penetrating the semiconductor component, results in an ionization effect which influences the concentration of the charge carriers stored on the memory elements such that a statistical distribution of the threshold voltages of the memory elements forms a contiguous region.

25 Claims, 13 Drawing Sheets

100

Irradiating the semiconductor component with erasing radiation until a target dose has been absorbed, wherein a statistical distribution of the threshold voltages of the memory elements forms a contiguous region ~102

(51) Int. Cl.
*G11C 16/04* (2006.01)
*G11C 11/56* (2006.01)
*G11C 16/16* (2006.01)

(58) Field of Classification Search
USPC .......................................................... 365/104
See application file for complete search history.

(56) References Cited

U.S. PATENT DOCUMENTS

| | | | |
|---|---|---|---|
| 4,964,143 A * | 10/1990 | Haskell | H01L 21/28273 |
| | | | 257/316 |
| 5,596,199 A | 1/1997 | McNulty et al. | |
| 5,656,521 A | 8/1997 | Hamilton et al. | |
| 5,745,411 A * | 4/1998 | Usami | G11C 16/34 |
| | | | 365/185.09 |
| 6,128,232 A | 10/2000 | Keller et al. | |
| 6,301,157 B1 * | 10/2001 | Riva | G11C 11/56 |
| | | | 365/185.03 |
| 7,616,501 B2 * | 11/2009 | Sporea | G11C 16/10 |
| | | | 365/185.01 |
| 8,659,941 B2 * | 2/2014 | Kamata | G11C 16/02 |
| | | | 365/103 |
| 8,853,615 B2 * | 10/2014 | Castellan | 250/252.1 |
| 9,293,420 B2 * | 3/2016 | Fogle | H01L 23/295 |
| 2005/0007808 A1 | 1/2005 | Johnson et al. | |
| 2011/0068385 A1 * | 3/2011 | Aoki | G06K 19/07749 |
| | | | 257/314 |

OTHER PUBLICATIONS

"Trends in Radiation Sterilization of Health Care Products", International Atomic Energy Agency, Vienna, 2008, 278 pages.
Cellere, G. et al., "Charge Loss After 60Co Irradiation of Flash Arrays", IEEE TNS, vol. 51, No. 5, Oct. 2004, pp. 2912-2916.
Gerardin, S. et al., "Radiation Effects in Flash Memories", IEEE TNS, vol. 60, No. 3,, Jun. 2013, pp. 1953-1969.
Reisswolf Deutschland GmbH, "DIN 66399", Retrieved from http://www.din66399.de/; 2012, 19 pages.
Snyder, E. S. et al., "Radiation Response of Floating Gate EEPROM Memory Cells", Sandia National Laboratories, Albuquerque, NM 87185, IEEE Transactions on Nuclear Science, vol. 36, No. 6, Dec. 1989, pp. 2131-2138.
Tal, Arie , "Two Technologies Compared: NOR vs. NAND White Paper", M-Systems, 91-SR-012-04-8L, Rev 1.1, Jul. 2003, 14 pages.
Wei, et al., "Reliably Erasing Data From Flash-Based Solid State Drives", FAST'11 Proceedings of the 9th USENIX conference, 2011, 13 pages.

* cited by examiner

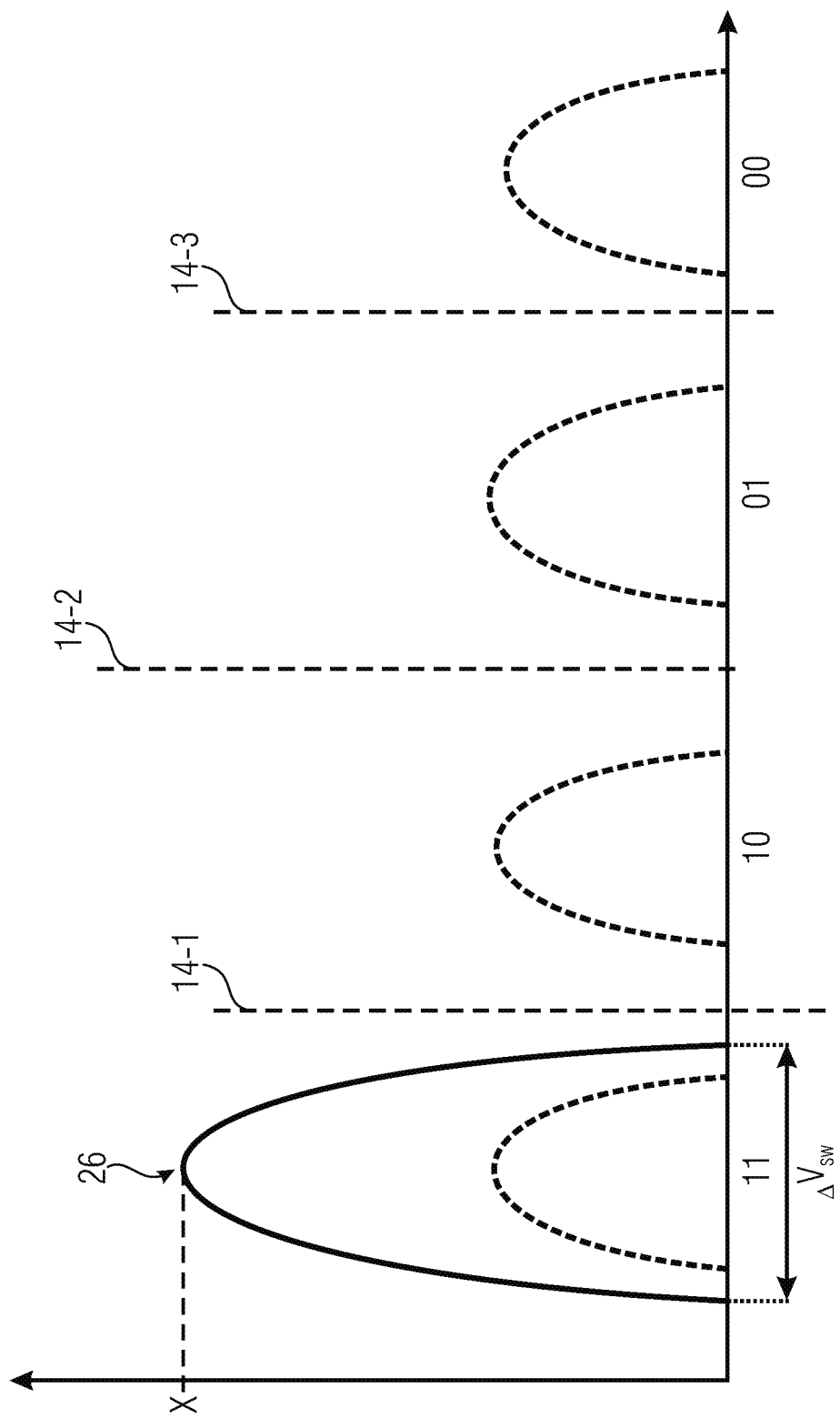

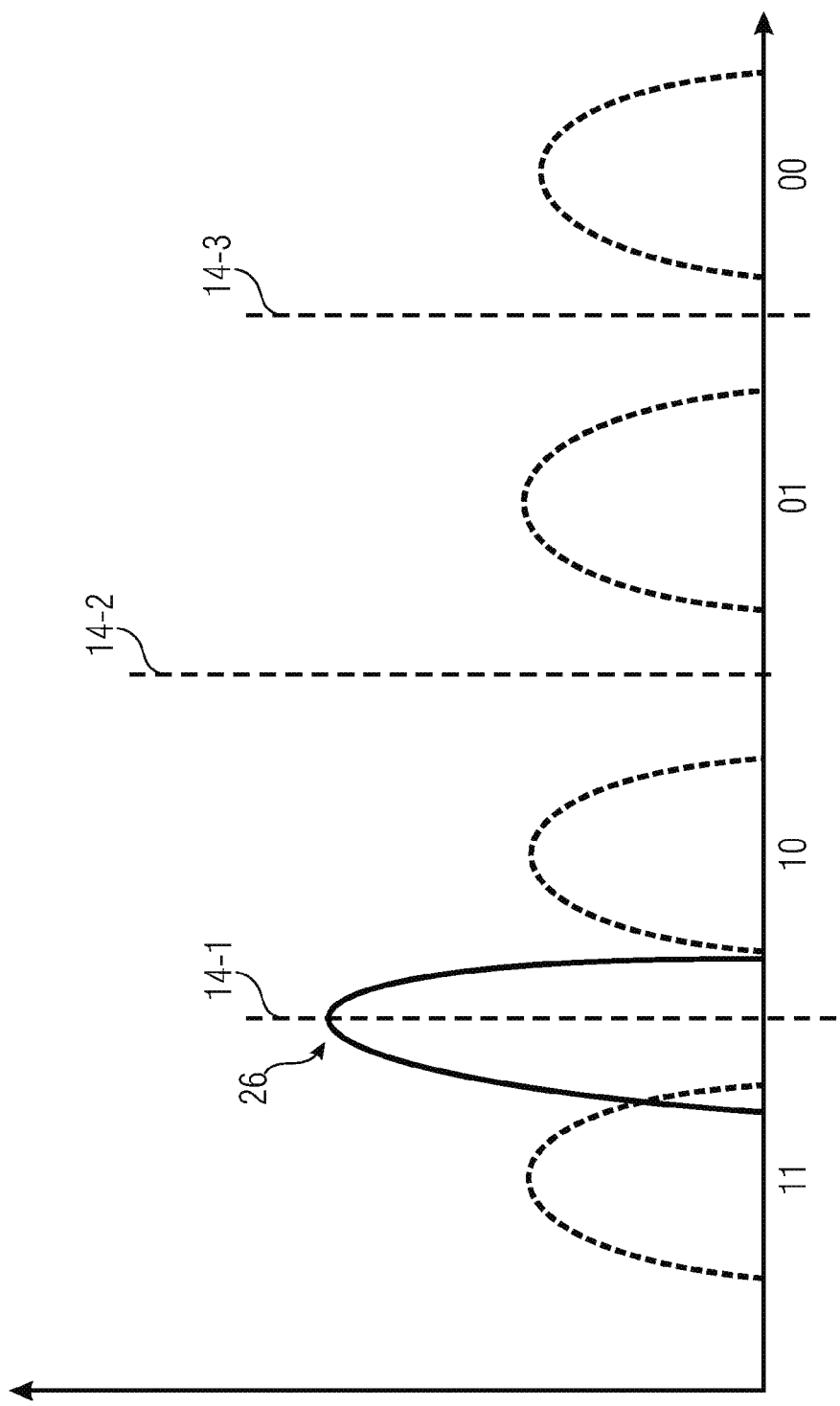

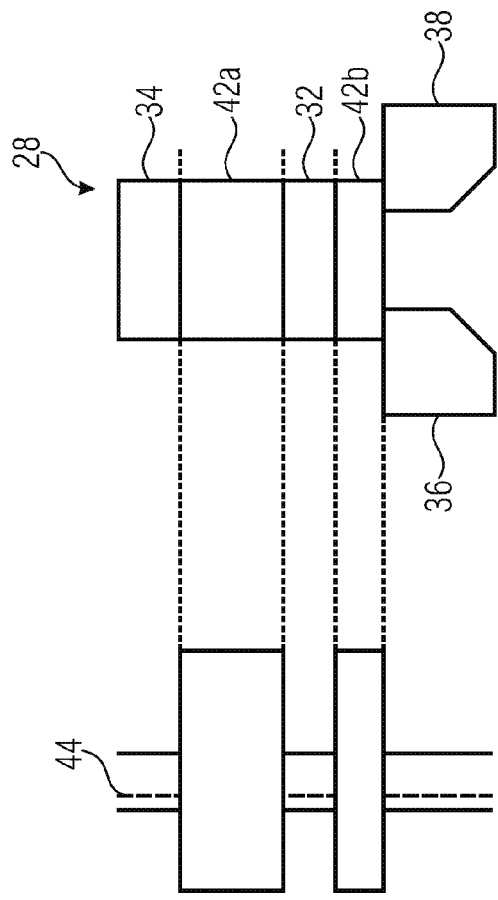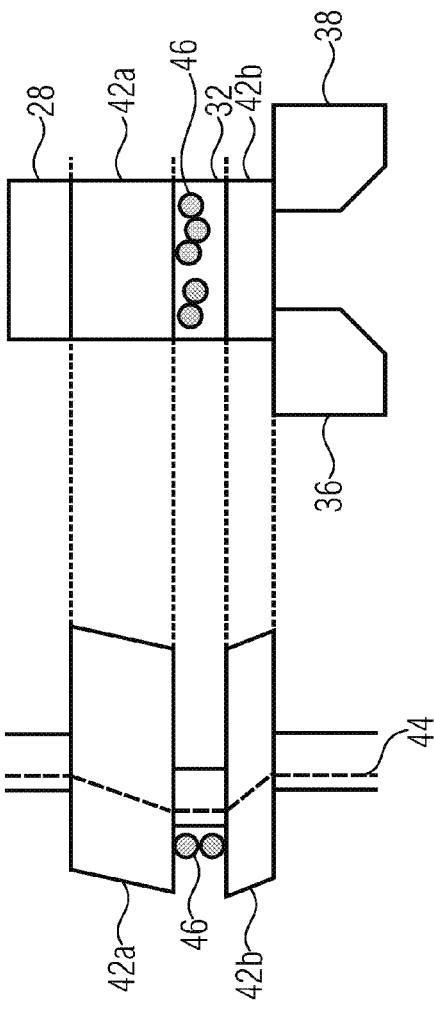
FIGURE 5A
FIGURE 5B

METHOD OF ERASING INFORMATION AND DEVICE FOR PERFORMING SAME

CROSS-REFERENCE TO RELATED APPLICATIONS

This application is a continuation of copending International Application No. PCT/EP2014/065393, filed Jul. 17, 2014, which claims priority from German Application No. 10 2013 214 214.5, filed Jul. 19, 2013, which are each incorporated herein in its entirety by this reference thereto.

BACKGROUND OF THE INVENTION

The present invention relates to a method of erasing information on a semiconductor component comprising a plurality of non-volatile memory elements by irradiating same with erasing radiation which penetrates the semiconductor component. Additionally, the present invention relates to a device for erasing information on an electronic semiconductor component comprising a plurality of non-volatile memory elements with irradiating means configured to expose the semiconductor component to erasing radiation, wherein the invention particularly relates to a method and a device for completely and permanently destroying information stored on data carriers by means of directly or indirectly ionizing radiation.

A plurality of data and files, such as, for example, secret documents, personal data, sensitive company data etc., is to be erased reliably or destroyed after expiry of retention periods or before disposing of the data carriers so as to satisfy legal obligations or prevent undesired spreading of the data.

Apart from a frequently insufficient erasure of information or data by means of software, there are three methods which are applied commercially for securely destroying electronically stored information and data. Apart from the so-called degaussing of magnetic data carriers and thermal destruction of the information or data by exceeding the Curie temperature of the data carrier, up to now the only possibility available for electronic memory of class E pursuant to DIN 66399 is mechanically crushing the data carriers. Variations of mechanical crushing differ, as regards different security stages, in the size of the particles produced by crushing.

Three stages of cleaning a data carrier and, consequently, erasing or destroying the information and data on the data carrier may be differentiated between. With logic cleaning, a first stage, the data, after cleaning, may no longer be accessed via standard interfaces of the data carrier. With digital cleaning, a second stage, accessing the data in any digital form is prevented after cleaning, even when bypassing the standard interfaces. With analog cleaning, a third stage, the analog signal which physically encodes the data is degraded, after cleaning, to such an extent that it may no longer be read, even when using the most advanced analog methods.

These three stages, in the order of logic cleaning, digital cleaning and analog cleaning, stand for an increasing erasing security for the data or data carriers from unauthorized access. With magnetic hard disk drives, the three stages may be represented as follows. Logically cleaning, meaning erasing the file, results in the file to be removed from the file allocation table (FAT) of the hard disk drive, wherein, however, the file itself is still present on the hard disk drive. Accessing the file by simply calling the file is prevented due to the erased entry in the FAT, the standard interface. Digital cleaning by overwriting the file to be erased results in renewed magnetization of the hard disk drive, wherein traces of the original magnetization may still be present. Analog cleaning means completely destroying the magnetization of the hard disk drive by means of a strong external magnetic field by means of degaussing or by exceeding the Curie temperature by heating up the hard disk drive. Alternatively, nearly analog cleaning may also be done by mechanical crushing. The number of bits which may potentially be restored or read out per particle are dependent on the size of the particles obtained when mechanically crushing and the physical dimension of the bit on the data memory.

Flash-based, non-volatile memories, such as, for example, flash electrically erasable programmable read-only memories (EEPROMs), are increasing in importance, either as a USB stick or memory card, as built-in permanent memory in smartphones or tablet PCs, or as a substitute for magnetic hard disk drives in the form of solid-state drives (SSDs). Non-volatile memories necessitate reliably methods for destroying sensitive data. There are approved and verified standards for optical and magnetic media. With electronic memories, for example flash memories, only mechanical crushing of the data carrier is known in order to achieve analog cleaning.

Flash memories are the most widespread type of non-volatile memories which are based on the principle of storing information by means of floating gates (FG). There are basically two different addressing technologies for flash memories: NOR and NAND. With NOR flash memories, directly writing on or reading from individual memory cells is possible. Thus, it is possible directly to call programs from an NOR flash memory. Erasing and programming the memory, however, are very slow, wherein the memories survive only about 10% of writing/reading cycles of an NAND memory with regard to lifetime before they become useless. A typical field of application for NOR flash memories is storing firmware.

In NAND flash memories, several cells are connected in series to form a PAGE, similar to an NAND gate, where the name comes from. The cells of a PAGE may then be read and written to only together. NAND memories generally exhibit a higher cell density and allow faster programming of the cells and a higher number of writing and reading cycles within their lifetime, as compared to NOR memories. NAND memories are used for mass storage and from an economic point of view, at present are the fastest growing technology. It is common to all flash memories that erasing memory cells and, thus, data at the same time is possible only for a larger block of memory cells.

Securely destroying data by overwriting is not possible, since in NAND flash memories, as are primarily used for mass storage, writing and, thus, programming a memory cell from state 1 to state 0 are possible only page-wise and erasing by offsetting the bits of the memory elements stored in the non-volatile memory elements from the logic state 0 to state 1 possible only in blocks, i.e. for a block of memory elements. Changes in the data usually are not done by overwriting the physical memory cells, but by means of writing the data to a different location of the data storage and by releasing the original location of the data storage. The data to be erased remain on the memory. The controllers of the data memory may advantageously use locations for writing new data which up to then were empty in order to compensate the disadvantage of finite ways of writing in the flash memory. This results in a reduced effectivity of erasing memory by means of overwriting. There may be regions on the data storage which are available only to the controller of the data storage for optimization purposes, but are inaccessible for the user. The result here is that the only way known so far or discussed for analog cleaning of electronic memories is mechanically crushing the data storage.

A way of cleaning electronic memory media from sensitive data most effectively, i.e. reliably and in an uncomplicated manner, would consequently be desirable.

SUMMARY

According to an embodiment, a method of erasing information stored on an electronic semiconductor component in a plurality of non-volatile memory elements may have the step of: irradiating the semiconductor component with erasing radiation until a target dose of the erasing radiation has been absorbed by the semiconductor component; wherein the erasing radiation penetrates the semiconductor component and at least part of the erasing radiation is absorbed in the semiconductor component with an ionization effect occurring, wherein, when the target dose is reached, the concentration of charge carriers stored on the memory elements is influenced by the ionization effect such that the statistical distribution of the threshold voltages of the memory elements forms a contiguous region; wherein the target dose of the erasing radiation is selected such that the statistical distribution permanently and irreversibly forms the contiguous region; and wherein the concentration of the charge carriers on the memory elements is changed by the ionization effect such that the concentration of charge carriers on the memory elements after the irradiation process is independent of the concentration of the charge carriers before the irradiating process.

According to another embodiment, a device for erasing information stored on an electronic semiconductor component in a plurality of non-volatile memory elements may have: irradiating means configured to expose the semiconductor component to erasing radiation until a target dose has been absorbed by the semiconductor component; wherein the erasing radiation penetrates the semiconductor component and at least part of the erasing radiation is absorbed in the semiconductor component with an ionization effect occurring, wherein the ionization effect influences the quantity of charge carriers stored on the memory elements such that the statistical distribution of the threshold voltages forms a contiguous region; wherein the target dose of the erasing radiation is selected such that the statistical distribution permanently and irreversibly forms the contiguous region; and wherein the concentration of the charge carriers on the memory elements is changed by the ionization effect such that the concentration of charge carriers on the memory elements after the irradiation process is independent of the concentration of the charge carriers before the irradiating process.

According to another embodiment, a device for erasing information stored on an electronic semiconductor component in a plurality of non-volatile memory elements may have: irradiating means configured to expose the semiconductor component to erasing radiation until a target dose has been absorbed by the semiconductor component; wherein the erasing radiation penetrates the semiconductor component and at least part of the erasing radiation is absorbed in the semiconductor component with an ionization effect occurring, wherein the ionization effect influences the quantity of charge carriers stored on the memory elements such that the statistical distribution of the threshold voltages forms a contiguous region; wherein the irradiating means is additionally configured to irradiate a container transparent for the erasing radiation in which the semiconductor component is located such that the container with the semiconductor components arranged therein is exposed to the erasing radiation; and wherein the irradiating means is additionally configured to irradiate the semiconductor component with the erasing radiation at different incident angles.

Another embodiment may have a device having an irreversibly erased semiconductor component having been erased using the above erasing method.

A finding of the present invention is that information stored on a semiconductor component or data carrier in non-volatile memory elements (such as, for example, stored logic states) may be erased or destroyed completely and permanently by exposing the semiconductor component provided with the memory element with (directly or indirectly) ionizing erasing radiation until the semiconductor component has absorbed a target dose of the erasing radiation, wherein, when reaching the target dose, the ionizing erasing radiation acting causes the concentration (for example distribution or density) of the charge carriers stored in the memory elements to be influenced or changed such that the concentration of charge carriers stored in the memory elements, obtained after the erasing process, is independent of the starting state before the erasing process. By means of irradiating a data memory with erasing radiation, a concentration of charge carriers stored on the memory elements of the charge carrier may be influenced such that the statistical distribution of the threshold voltages of the memory elements, after irradiation, forms a contiguous region and, consequently, data or information are erased securely.

Embodiments exhibit a method of erasing information stored on an electronic semiconductor component in a plurality of non-volatile memory elements. By means of irradiating the semiconductor component with erasing radiation which penetrates the semiconductor component, the result is an ionization effect within the semiconductor component which influences the concentration of charge carriers stored on the memory elements. By means of maintaining the radiation until the target dose of erasing radiation has been absorbed by the semiconductor component, the statistical distribution of the threshold voltages of the memory elements is influenced such that the statistical distribution forms a contiguous region.

Of advantage with this embodiment is the fact that the memory elements, due to the contiguous statistical distribution of the threshold voltage region, exhibit a uniform logic state which is independent of a logic state of the memory elements before irradiation.

Another embodiment shows a method of erasing information stored on an electronic semiconductor component in a plurality of non-volatile memory elements. Memory states of the respective memory elements are influenced while irradiating the semiconductor component with erasing radiation such that the respective memory state after the irradiating process is independent of the memory state before the irradiating process. Of advantage with this embodiment is the fact that so-called multi-state memory cells, the memory states of which may be represented by more than one bit may also be transferred to a uniform state, irrespective of a starting state.

Another embodiment of the present invention shows a device for erasing information stored on an electronic semiconductor component in a plurality of non-volatile memory elements. The device includes irradiating means configured to expose the semiconductor component to erasing radiation until a target dose has been reached.

Of advantage with this embodiment is the fact that the device leaves the semiconductor component mechanically undamaged in that the semiconductor component or a erasing object (device) comprising the semiconductor component may subsequently be identified or the application of the method on the device be verified, for example by its owner. Alternatively or additionally, the semiconductor component or erasure object or the device comprising the semiconductor component may be protected from unauthorized access by third parties in a sealable container or container securable by means of a seal or by other packaging.

Characteristics of electronic semiconductor memories, in particular flash memories, will be discussed below in greater detail, wherein additionally the findings and inventive conclusions of the inventors are emphasized, considering the object underlying the present invention.

BRIEF DESCRIPTION OF THE DRAWINGS

Potential embodiments of the present invention will be detailed subsequently referring to the appended drawings, in which:

FIGS. 4b-c show statistical distributions of the memory elements starting from FIG. 4a, after the memory elements have absorbed a target dose;

FIG. 5a shows a schematic setup of a memory element, exemplarily in the form of a metal oxide semiconductor field-effect transistor (MOSFET), in an unprogrammed state;

FIG. 5b shows the schematic illustration of the MOSFET, in analogy to FIG. 5a, in a programmed state;

DETAILED DESCRIPTION OF THE INVENTION

Figure 1:
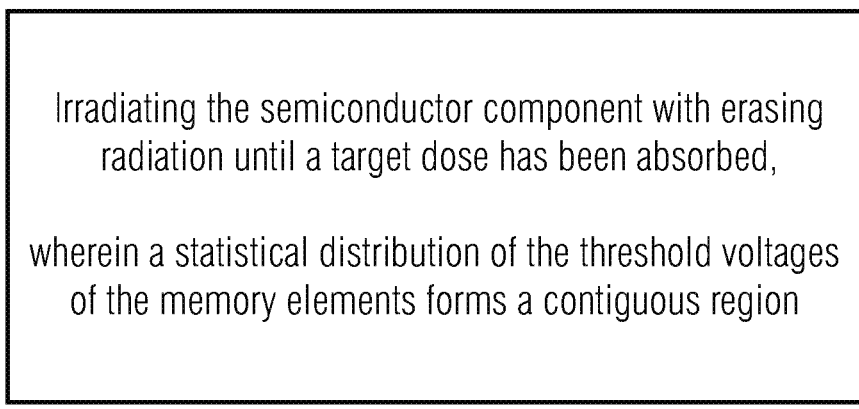
FIG. 1 shows a schematic flowchart of a method of erasing information on an electronic memory by means of irradiating.

Before describing in greater detail below embodiments of the present invention using the drawings, it is pointed out that identical elements, objects and/or structures or those of equal function or equal effect are provided with same reference numerals in the different figures such that the description of these elements illustrated in different embodiments is mutually exchangeable or may be applied correspondingly.

Although embodiments and discussions below partly relate to memory elements comprising a floating gate for storing negative charge carriers, the following embodiments and discussions may be equally applied to other electronic memory elements, for example comprising a floating gate for storing positive charge carriers.

Figure 3A:
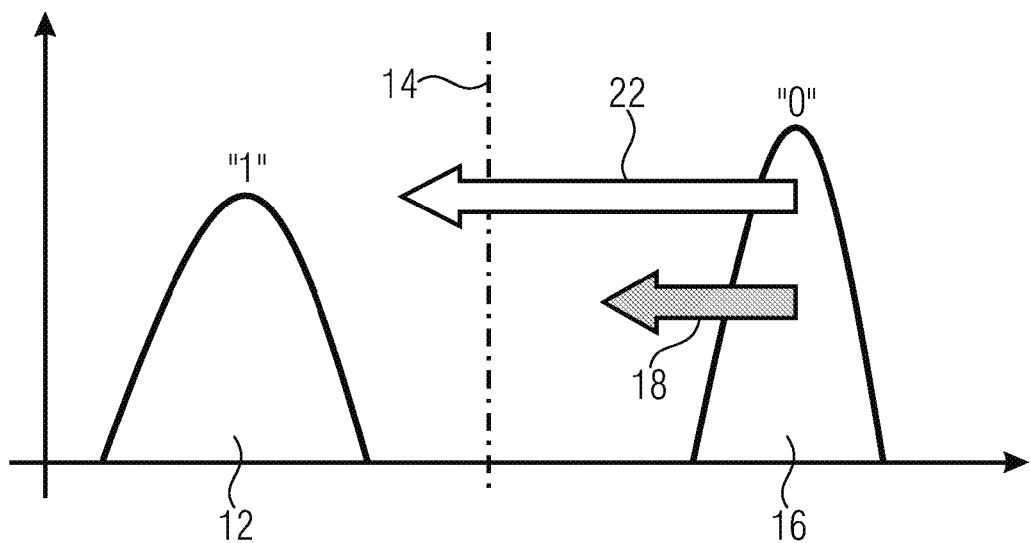
FIG. 3a shows a schematic illustration of statistical distributions of threshold voltages of a plurality of single-level cell (SLC) memory elements.
Figure 3B:
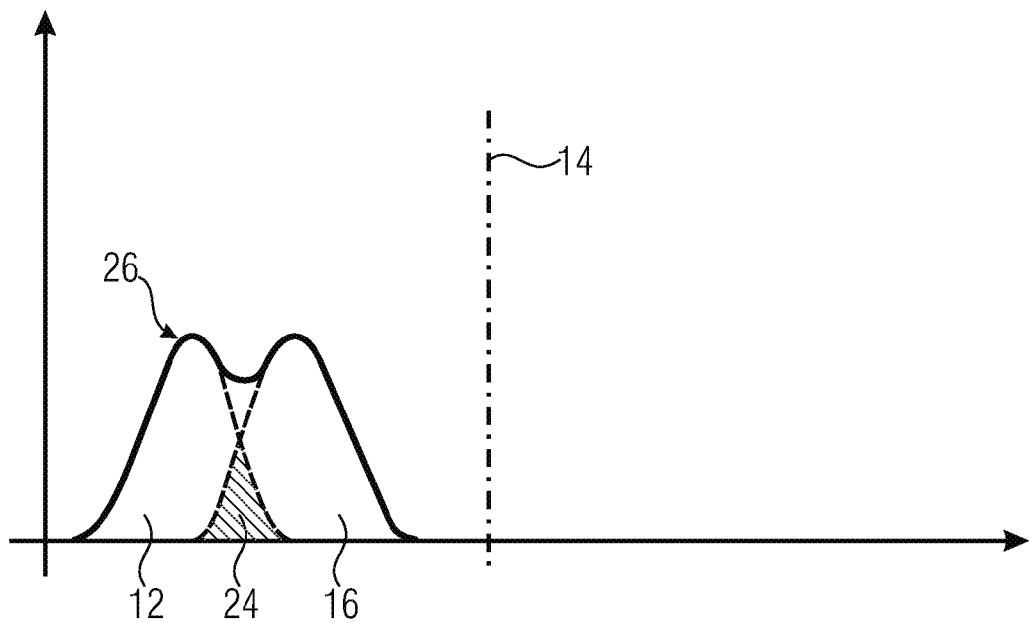
FIGS. 3b-3c show statistical distributions of the memory elements starting from FIG. 3a, after the memory elements have absorbed a target dose.
Figure 6:
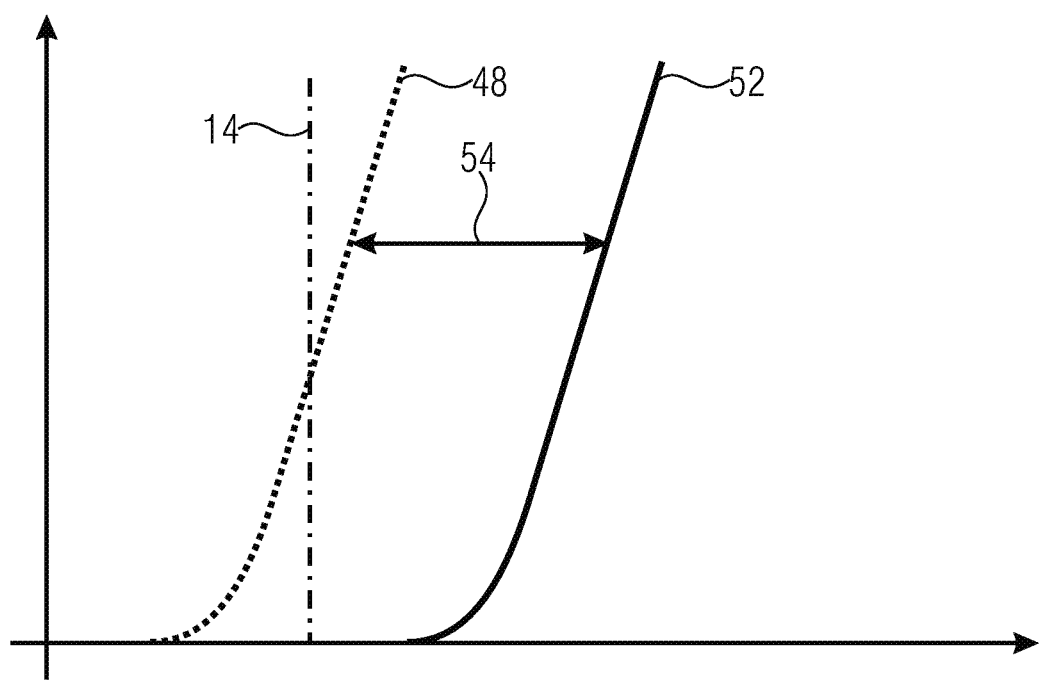
FIG. 6 shows a schematic graphical course of voltage-current curves of an unprogrammed and a programmed memory cell of an MOSFET.
Figure 7:
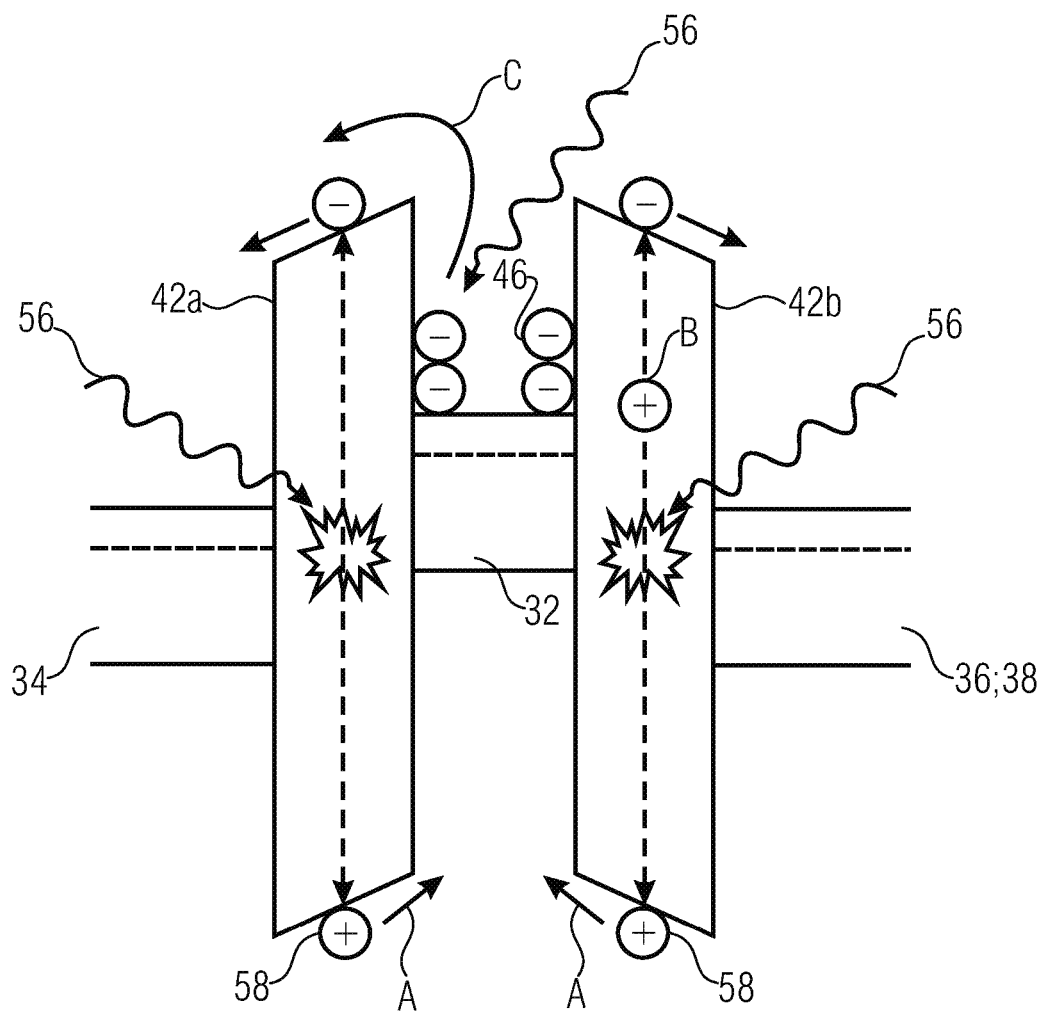
FIG. 7 shows a schematic illustration of the effects of ionizing radiation on a flash memory element of a semiconductor component.

A method of erasing information stored on an electronic semiconductor component in a plurality of non-volatile memory elements will be discussed below referring to FIG. 1, also making reference to FIGS. 3a, 3b, 4b, 5b, 6 and 7. FIG. 3a shows a schematic illustration of statistical distributions of threshold value voltages of a plurality of single-level cell (SLC) memory elements, FIG. 3b shows the statistical distributions of memory elements in analogy to FIG. 3a, after the memory elements have absorbed a target dose. FIG. 4b shows the statistical distribution of the unprogrammed memory element and the statistical distributions of the programmed memory elements of a plurality of multi-level cell (MLC) memory elements after irradiation. FIG. 5b shows the schematic illustrations of a metal oxide semiconductor field-effect transistor (MOSFET) in a programmed state of the memory element. FIG. 6 shows a schematic graph comprising voltage-current curves of an unprogrammed (erased) and a programmed memory cell of an MOSFET, wherein programmed memory cell here means a state of the memory cell where charge carriers are stored on the floating gate. However, a different labeling of states of the memory cells may also be used, in particular when several different concentrations of charge carriers are differentiated between, such as, for example, in MLC memory elements. FIG. 7 shows a schematic illustration of the effects of ionizing radiation on a flash memory element of a semiconductor component.

FIG. 1 shows a method 100 of erasing information on an electronic memory comprising a plurality of non-volatile memory elements. Erasing may exemplarily mean completely (i.e. 100% of memory elements) or predominantly (exemplarily 99.99%, 99.9999% or 99.999999%) resetting the memory elements to an unprogrammed state, wherein memory elements which may not have been reset are distributed on the semiconductor component to be non-contiguous such that individual un-reset bits do not allow drawing conclusions as to the data or information stored before. The semiconductor component, such as, for example, a flash memory, a field-programmable gate array (FPGA) or a non-volatile memory element of a microcontroller, an erasable programmable read-only memory (EPROM) or EEPROM, may be part of a memory device, for example an SSD, a USB stick, memory card or chip card. The memory device may be part of a system, for example a personal computer (PC), cellphone, in particular a smartphone, a tablet PC or notebook. Descriptions below relating to an arrangement of semiconductor components are to be understood such that the semiconductor components may be arranged in a memory device and the respective memory device may be part of a system. A erasing object relates to a semiconductor component which may be arranged in a memory device, wherein the memory device may be arranged in or at a system or apparatus.

In step 102, a semiconductor component comprising a plurality of non-volatile memory elements which, in dependence on a respective realization, represent one or several bits of information are irradiated with erasing radiation. The information to be erased are stored on the memory elements, for example transistors with a floating gate, in the form of a concentration of electrical charge carriers on the floating gates of the memory elements, as is illustrated, for example, in FIGS. 3a and 5b. During a programming process, charge carriers are introduced onto a respective floating gate, the charge carriers being present in a concentration (or density or distribution) and representing the programmed state. Irradiation takes place until the target dose (set dose) of erasing radiation has been absorbed by the semiconductor component. Depending on the type of erasing radiation used, such as, for example, electron or proton radiation, absorption may take place completely or partly by slowing down a particle of the radiation after an interaction, for example collision, with the semiconductor component or one of the memory elements. Alternatively or additionally, absorption may take place completely or partly by means of neutralizing the particle of the radiation within the memory element. Alternatively or additionally, absorption may take place completely or partly by reducing energy of a radiation wave, while the erasing radiation wave penetrates the semiconductor component. Absorption of the erasing radiation within the semiconductor component includes, with the course of the radiation through the semiconductor component, a reduction in the radiation intensity and/or a reduction in a number of radiation particles.

The absorption of the portion of erasing radiation, in the semiconductor component, results in an ionizing effect occurring which influences a concentration of charge carriers stored on the memory elements. The charge carriers or concentration of the charge carriers on the memory elements define a logic state of the respective memory element, as is shown in FIGS. 3b and 4b. The ionization effect exemplarily results in a reduction in an electrical charge stored on a floating gate by means of different mechanisms which will be discussed below referring to FIG. 7. A reduction in the concentration of electrical charge carriers on the floating gate of a memory element may result in a decrease in a threshold voltage of the respective memory element below a reading voltage, as is illustrated referring to FIGS. 3a and 3b, such that a memory element, for example in a programmed state, may be recognized by an apparatus reading out the semiconductor component or memory device to be "unprogrammed" and no code processable further may be read out or restored, since the original state of the memory elements can no longer be restored.

The method 100 allows contactless and reliable erasure of data or information by removing the information in the form of electrical charge carriers from the floating gates which exhibit a corresponding programming. Thus, the erasure process is irreversible and permanent such that a reliable erasure of the data or information is possible. In other words, the method 100 described here describes a method of permanently destroying data in electronic memory media comprising non-volatile memory elements.

Information or sensitive data on any kind of apparatuses which use non-volatile memory elements on the basis of charge storage may be erased by applying the method. The semiconductor components, memory devices or systems do not need to be opened for this purpose. The semiconductor components, potentially as part of the respective memory device or system (the apparatuses provided with the semiconductor components) are exposed to the erasing radiation, exemplarily ionizing radiation. Wave radiation, for example electron radiation or photon radiation, or particle radiation, for example proton radiation or neutron radiation, may exemplarily be used as ionizing radiation. Alternatively or additionally, irradiation may be performed using radiation of heavy ions. The type and energy of the ionizing radiation may be selected such that the memory elements, maybe within a casing of a memory device, are exposed to the radiation, the memory elements are penetrated by the ionizing radiation and absorb part of the ionizing radiation.

Due to the ionization effects described below in FIG. 7, the ionizing radiation causes a change in the threshold voltages of the individual memory elements. The change of the threshold voltage may be caused by one of the three effects discussed below or by a combination of these effects. In a first effect, referred to in FIG. 7 as effect A, the ionizing radiation causes charges in the insulators surrounding the floating gate to be generated or released. These charges penetrate into the floating gate and neutralize the charge stored on the floating gate at least partly. A second effect B has the result that a charge from the floating gate is caught, i.e. bound, in the insulators at voids generated by the ionizing radiation and thus charge carriers on the floating gate are masked. A third effect C is photoemission. The energy level of the charge carriers in the floating gate is increased by the radiation such that the charge carriers comprise enough energy in order to overcome the potential barrier of the insulator surrounding the floating gate. Generally, effect B is small (less than 10%) compared to effects A and C.

In summary, ionizing radiation results in the floating gate to be discharged and thus in a shift of the characteristic curve, illustrated in FIG. 6, of the resulting drain current in dependence on a voltage applied at the control gate. After the respective memory element has absorbed the target dose, the threshold voltage of the memory element is reduced and, thus, the characteristic curve 52 shifted in the direction of the characteristic curve 48 of FIG. 6 to an extent such that a reading voltage 14 maintained does not identify an originally programmed memory cell or originally programmed memory element as such. The memory element is identified to be unprogrammed.

Over the sum of all the memory elements which in their respective states are subject to a statistical distribution, the statistical distributions 12 and 16 form regions relative to the threshold voltages of the memory elements, as is discussed in FIGS. 3a and 3b. A discharge of the floating gates or adapting the charge states (or charge density) of the floating gates results in an approximation of the statistical regions 12 and 16. After having absorbed the target dose, the regions of the statistical distributions 12 and 16 form a common region 26.

No reading voltage which allows error-free differentiation between programmed and unprogrammed memory elements and thus the original logic states thereof, may be defined within the common region 26. The statistical distributions 12 and 16 may exemplarily be caused by small variations of the processes in chip manufacturing. This may result in a variance of the threshold voltages. The threshold voltages of the memory elements may thus be influenced by the charge carriers on the floating gate and/or variances. Memory cells, or memory elements, the threshold voltage of which falls below the reading voltage, are interpreted, with a single-level cell (SLC), for example, to be a binary state 1, i.e. unprogrammed. When charge carriers are increasingly removed from the floating gate of the memory device or neutralized with an increasing radiation dose absorbed by the memory devices, a concentration of the charge carriers on the floating gate decreases, wherein the statistical distribution of originally programmed cells migrates in the direction of the statistical distribution of the cells in an unprogrammed state. After having absorbed the target dose of radiation, the memory elements are in a neutral state. Thus, analog cleaning which corresponds to an analogy for degaussing in magnetic hard disk drives may be achieved.

After having absorbed the target dose, both the originally programmed and originally unprogrammed memory elements are in an unprogrammed state, irrespective of their respective starting states. Thus, a dependence on a starting state of the memory elements is eliminated.

The radiation used needs to have a certain (i.e. sufficient) energy in order to be able to completely penetrate the charge carriers so as to ensure irradiation of each memory cell or each memory element. Complete penetration here means that all regions are penetrated spatially (i.e. all regions are penetrated completely or uniformly) and a sufficiently high portion (exemplarily 99% or 99.999%) of the memory elements, in the ideal case all of them (100%), are exposed to the ionization effect such that, after having absorbed the target dose, the concentration of charge carriers stored is influenced such that the statistical distribution of the threshold voltages of the memory elements forms a contiguous region. This means that the concentration of charge carriers after the irradiation process, irrespective of the concentration of charge carriers before the irradiation process, is such that the original logic state of the memory elements can no longer be found out. A remaining portion of memory elements (exemplarily a portion of less than 1% or less than 0.001%) not having been exposed to the ionization effect, or not sufficiently, is generally distributed on the semiconductor component such that no relevant fragments of information stored on the semiconductor memory may be restored. An energy of the radiation to be absorbed by the semiconductor component which results in a potentially complete penetration of the semiconductor component may be defined for defining the target dose.

The target dose or minimum dose here may be determined in dependence on the erasing object to be erased or the semiconductor component. Determining the target dose may take place, alternatively or additionally to be dependent on the density or materials of the semiconductor component, the memory device or the system. Embodiments show erasing methods with a target dose of 1 kGy for memory devices to be erased. Alternative embodiments show a target dose of 5 to 8 kGy. Further embodiments show a target dose of 10 kGy.

Alternatively or additionally, an irradiation time may be determined in dependence on a radiation source of the ionizing radiation. For a radiation power of the radiation source of, for example, 6 kGy/h and an energy of the radiation emitted by the radiation source, a target dose of, for example 2 kGy results for a semiconductor component. An irradiation time of, for example, 2 kGy/6 (kGy/h)=0.3 h=18 min may be determined from this. An increased (sensitive) volume to be irradiated, i.e. volume which is irradiated so as to absorb the target dose, for example due to a greater semiconductor component or several semiconductor components or apparatuses irradiated simultaneously, may result in a reduced energy and thus radiation power with regard to the volume irradiated, from which may result a prolonged irradiation duration.

The method 100 may be applied irrespective of determining further application parameters, such as, for example, a dose rate or temperature.

The method 100 here may be executed such that apparatuses and/or semiconductor components are exposed to continuous radiation until the target dose has been reached. In alternative embodiments, irradiation takes place in several steps, wherein the intensity or duration of the steps may vary. It may be necessitated for the target dose to be determined experimentally or by means of simulation, for example for different "classes" of erasing objects, such as, for example, tablet PCs or external memory media. In experimental determination, several erasing objects for which the target dose is to be determined may, for example, be exposed to different (predetermined) radiation doses. After irradiating, evaluation, maybe forensic analysis, may take place in order to determine the respective erasing state of a erasing object in dependence on the radiation dose absorbed.

In a specific example, a total of N (N=100) secure digital (SD) memory cards may, for example, be exposed to ionizing radiation until a dose of 0.2, 2, 20 or 200 kGy has been absorbed by N/4 (25) SD cards each. In a subsequent forensic examination, it may be detectable that SD cards having absorbed a dose of 0.2 kGy may still be read out using a standard interface, like an SD card reader in a PC. Additionally, it may be detected that SD cards having absorbed a dose of 2 kGy may be read out only with increased complexity while bypassing standard interfaces, which is comparable to digital cleaning of magnetic hard disk drives. Furthermore, it may be determined that SD cards having absorbed a dose of 20 kGy do not comprise residual charges, or only minimum residual charges, on the respective floating gates of the memory devices of the SD cards, wherein cards having absorbed a dose of 200 kGy additionally exhibit a color (physical or chemical) change in the plastic parts of the SD cards and electronic components are destroyed such that the SD cards are inoperable and no reproducible writing and/or reading accesses may be executed. Destroying the electronic components may be caused by changing the insulation structures of the devices which lose an electrically insulating characteristic at least partly such that the functionality of the electronic components is eliminated at least partly.

When looking at such an exemplary number of trials, it may, for example, be deduced that based on the results for the dose of 2 kGy, provided with a safety factor of 1.5, a target dose of 3 kGy allows reliable digital cleaning. It may, for example, also be deduced that a dose of 10 kGy allows the information or data stored on the SD cards to be erased sufficiently for analog cleaning, since half of the dose of 20 kGy (see above) causes only as many charge carriers to remain on the floating gates of the SD cards that restoring the original data or information is prevented. The target dose for the SD cards of the type examined may be determined, when using the above exemplary assumptions and results for 10 kGy, by interpolation of the results for the absorbed doses of 2 kGy and 20 kGy. Alternative embodiments show the target dose for the above SD cards to be determined to exhibit a value of 20 kGy, since after the SD cards have absorbed this dose, nearly all of the charge carriers stored on the floating gate have been removed.

The target dose here may also be selected such that the semiconductor component, after having absorbed the target dose, is inoperable, i.e. chemical or physical changes have taken place in the semiconductor component, preventing reproducible writing and/or reading processes. In the above example, this corresponds to an absorbed dose of 200 kGy.

In summary, it may be stated that target doses may be determined by experimental trials and subsequent forensic examinations, wherein the experimental results may be derived by news of interpolation steps and may be provided with safety factors.

The target dose may also be determined by means of simulations, by the absorption of a radiation dose by a erasing object to be performed using simulations, for example in a simulation program. In particular, simulations may be based on past experimental determinations. A new type of SD cards, possibly with a newly produced type of semiconductor component may, for example, be examined as to its similarities with semiconductor components examined already such that calculation of a target dose may be done based on simulations and/or experimental trial and/or calculation results.

It is noted here that the above example is only representative of potential embodiments of an experimental or simulation determination of a target dose for a type of erasing object.

Within an irradiation step, the ionizing radiation causes a potentially continuous decrease in the charge stored on the floating gate. After having absorbed the target dose, little or no stored charges are present in the memory cells or memory elements, meaning that the information have been erased.

By using ionizing radiation, the method 100 allows the semiconductor component, the apparatus or system to be arranged, during irradiation or during the entire data destruction process, in a packaging (exemplarily a container or casing) which is, for example, sealed or secured differently. Due to the radiation penetrating, one or several memory components, memory devices or systems may be arranged within the packaging.

The packaging is also penetrated by the radiation during irradiation. Thus, a certain portion of the radiation may be absorbed by the casing. A radiation portion absorbed by the casing may be considered when determining the target dose relative to the respective radiation source, for example by increasing the radiation duration.

Since physical or mechanical access to the data carriers or semiconductor components is not necessary during irradiation, data destruction may take place in a closed, for example sealed, packaging or container, whereas, during mechanical crushing, each data carrier has to be fed to destruction by persons and/or automatic machines. This necessitates a trusted cooperation with a corresponding service provider executing the method, since data carriers are in particular misused by persons, or the data carriers and/or data or information stored thereon may be accessed by persons in an unauthorized manner. This may be prevented by a closed packaging or unauthorized access may be determined when the sealing or the packaging is damaged.

Generally, ionizing radiation is able to influence information on electronic memory media. Depending on the type of memory, i.e. the type of the semiconductor component to be irradiated and the type of radiation used, as well as the radiation quantity or dose, after irradiation, parts of the memory and the entire information have changed such that restoring the original data is prevented due to lacking dependencies of the memory states and/or erroneous semiconductor elements of the memory elements. Thus, the method describes completely and permanently destroying information in electronic memory media by using ionizing radiation. The data carrier or semiconductor component containing the information to be destroyed is exposed to a sufficient amount of radiation until the target dose has been absorbed the semiconductor component.

Mechanical crushing may have the result that an identity of the data memory or the apparatus may technologically no longer be proven, for example due to particles that are too small or mixing of particles of different apparatuses. Since, however, the semiconductor component, the memory device or the system are mechanically intact after having destroyed the data using the method 100, verification or identification of the semiconductor component, for example by the customer or the owner, is still possible. Secure destruction of the data may also be ensured irrespective of mechanical process parameters, such as, for example, a particle size determined by mechanical crushing. With an increasing density of memory elements on the semiconductor component, i.e. increasing memory densities, mechanical crushing necessitates decreasing and smaller particle sizes in order to keep constant or reduce a number of memory elements and thus the quantity of data present per particle. Mechanical crushing of semiconductor components may result in mixed particles of different materials and, thus, residual waste or special waste which may contain hazardous materials and reusable materials. A data carrier erased by means of radiation, in contrast, allows further processing, for example recycling, since a large part of the data carrier remains mechanically intact and may, for example, be dismantled and separated by material.

All in all, destroying data by means of irradiating using the method 100 allows erasing information with a considerably reduced risk of wrongdoing of individual persons. Although the systems, memory devices or semiconductor components, after being irradiated, remain largely mechanically intact, the method 100 may cause some typical and irreversible mechanical or optical changes, for example in the plastics used in the apparatuses or semiconductor components. Depending on the chemical composition of the plastics, plastics may become brittle or soft or exhibit discoloring. This change may exemplarily be detected in a forensic analysis afterwards, for example verification of the method 100. Apart from the state of the data destroyed, radiation damage, caused by irradiation, on the elements irradiated, for example in the semiconductor components, insulators or plastics, may provide characteristic traces which prove application of the method 100 retrospectively. Alternatively or additionally, optical changes, for example with glasses or transparent polymers, may be detected, for example by the fact that transparent elements, when being irradiated, at first become darker and finally completely opaque.

Irradiated electronic or optical components, for example semiconductor components, lenses in cameras or displays, may be damaged irreparably by the method 100. This increases security of data destruction and prevents usage of the apparatuses after data destruction, for example by unauthorized stealing of the apparatuses of memories erased. The damage of the electronic components results from a strong increase in leakage currents in electrical components which use insulators. Additionally, characteristic curves of semiconductor elements may be shifted by charges generated and stored in insulators. Such changes may be detected in the form of characteristic traces and may be differentiated clearly from aging processes. Detecting the characteristic traces allows verification of the erasing method 100.

An indicator element, for example in the form of a plate, pipe, rod, cylinder or cube, which changes a physical or chemical characteristic when the target dose has been reached may be irradiated together with the semiconductor component, the memory device or the system. A changing physical characteristic may, for example, be toughness or rigidity of the glass or polymer or transparency of the material. A changing chemical characteristic may, for example, be a color of a paper of the indicator element. The indicator element may, for example, be arranged at or in a corresponding packaging or container or be formed completely or partly from glass or a polymer material. The polymer materials may be transparent or opaque completely or partly.

Destroying the data using irradiation may take place quickly and cheaply, since large quantities of data carriers may be irradiated simultaneously. Application of the method may be checked on since a customer may get back the data carrier/s after successful irradiation. In addition, applying the method 100 may be implemented transparently by disclosing details of the method. In addition, the method 100 may be executed by non-trusted persons at low risk, since the method 100 allows a complete logistics chain including sealed packaging.

In embodiments, irradiation takes place such that the one or several semiconductor components, memory devices and/or systems are irradiated from different angles until the target dose has been absorbed by the semiconductor components. The semiconductor component/s may be moved past a stationary radiation source by transport means, for example on a conveyor belt. Alternatively or additionally, the semiconductor component/s, for example in a state enclosed by a sealed packaging, may be turned in front of the stationary radiation source so as to allow irradiation of the semiconductor component/s from several sides. This allows a reduction in variations in intensity which may be occurring within the irradiated region which may, for example, be caused by radiation absorption in the semiconductor components.

The semiconductor component or semiconductor components may be moved relative to the radiation source into and/or through an irradiation region at a transport speed and be exposed to the radiation while being moved. The transport speed may be adjusted to the target dose absorbed by the semiconductor components. A reduced transport speed may, compared to a higher transport speed, result in a slower passing through the irradiation region and a higher radiation dose absorbed. This allows continuous transport of the semiconductor components. Alternatively or additionally, the semiconductor component or the semiconductor components may be moved into the radiation region and be placed there and moved out from the radiation region after having absorbed the target dose ("stop and go" operation). Both in "stop and go" operation and when moving the semiconductor components using relative movement, the semiconductor components or containers in which the semiconductor components are arranged may be turned once or several times, maybe continuously relative to the radiation source so as to be irradiated with the ionizing radiation from different angles.

Figure 2:
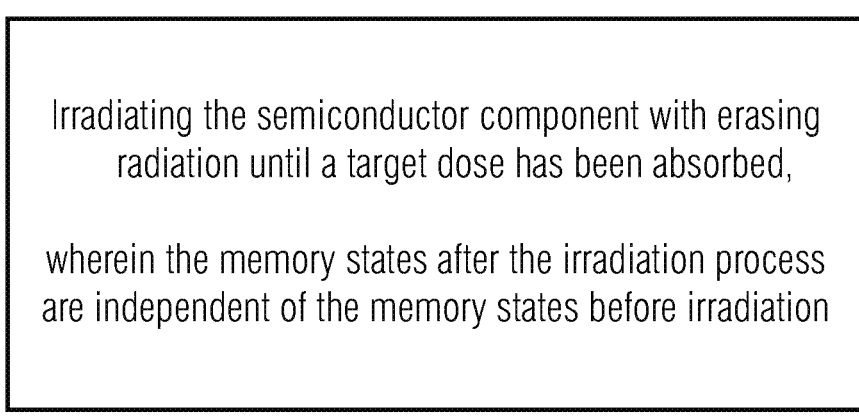
FIG. 2 shows a schematic flowchart of another method of erasing information stored on an electronic semiconductor component.
Figure 4A:
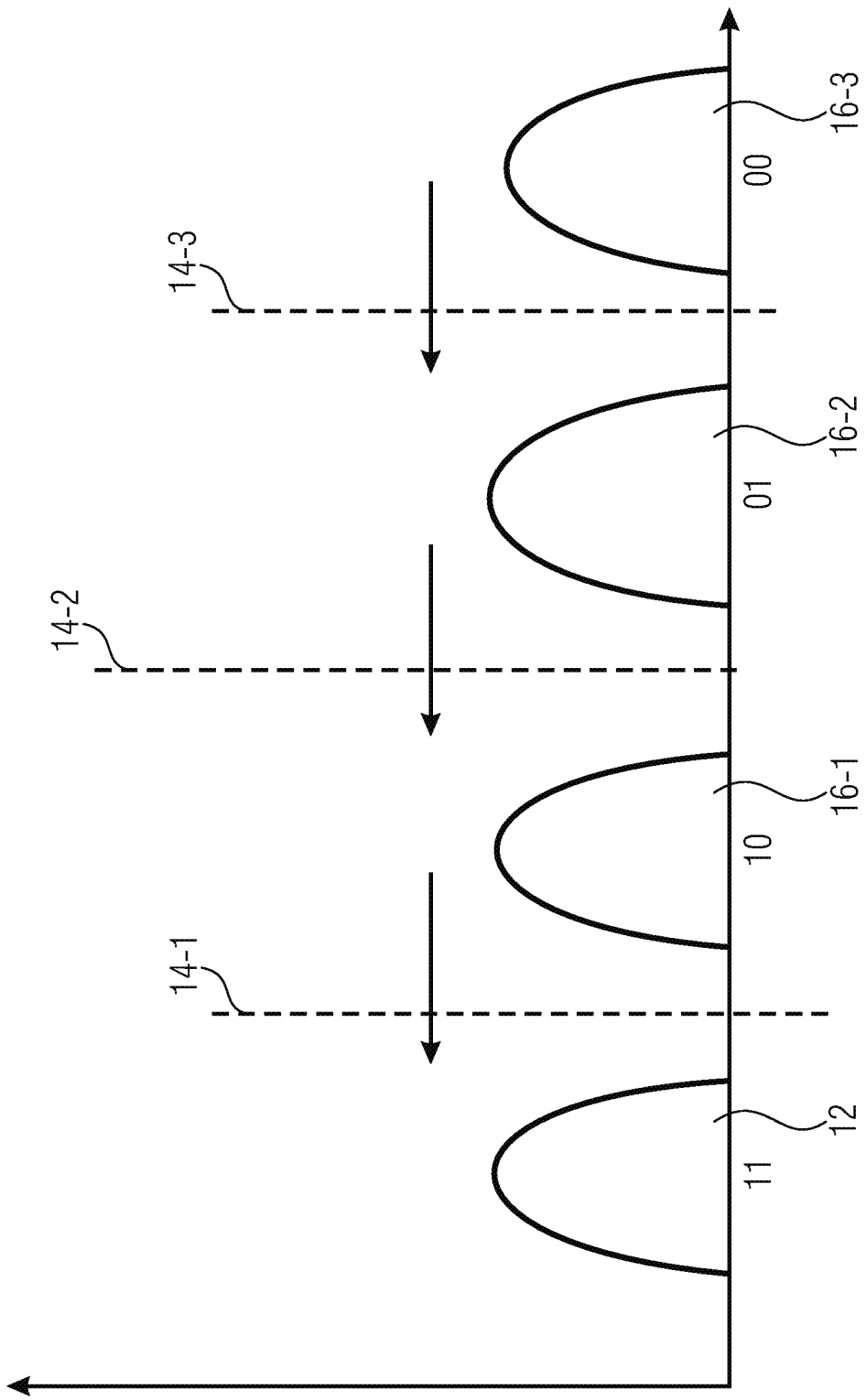
FIG. 4a shows the statistical distribution of the unprogrammed memory elements and the statistical distributions of the programmed memory elements of a plurality of multi-level cell (MLC) memory elements.

FIG. 2, making reference to FIG. 4a and FIG. 4b, shows a schematic flowchart of a method 200 of erasing information stored each as a memory state on an electronic semiconductor component in a plurality of non-volatile memory elements. In an SLC, a memory state exemplarily includes differentiation of a state of a bit as zero and one. In the case of a multi-level cell (MLC), several memory states, for example, four, may be realized in a memory element, which may be interpreted as being four logic states, for example a bit combination of "00", "01", "10" and "11).

FIG. 4a exemplarily shows a schematic illustration of statistical distributions of memory elements of a semiconductor component including MLCs, the respective memory state of which represents two bits, and consequently four states. FIG. 4b schematically shows the statistical distribution of the memory element after being irradiated in accordance with step 102 or step 202.

In step 202, the semiconductor component is irradiated by erasing radiation until the target dose has been absorbed by the semiconductor component. The erasing radiation penetrates the semiconductor component during irradiation such that at least part of the erasing radiation is absorbed in the semiconductor component. Absorbing part of the erasing radiation results in an ionizing effect occurring in the semiconductor component or memory elements. The ionizing effect has the result that the memory states of the memory elements are influenced such that the memory states, after the irradiation process, are independent of the memory states before the irradiation process, as soon as the target dose has been absorbed.

The method describes a method of completely and permanently destroying information stored on data carriers by means of directly or indirectly ionizing radiation. The method may smoothly make use of existing infrastructures, established over years, of existing companies which at present may use different methods. Among these are logistics chains, certified as being secure, from a customer to the place of destruction, customer relations to authorities, institutions and companies and common verification methods for checking effectivity. All in all, the method may be applied world-wide, in particular where information on data carriers are to be destroyed.

The methods 100 and 200 may basically be applied for all memory technologies based on floating gates, wherein the respective discussions are mutually applicable and exchangeable.

FIG. 3a shows a schematic illustration of statistical distributions of threshold value voltages of a plurality of SLC memory elements. The abscissa represents, in an ascending manner, the threshold value voltage at a control gate of the corresponding memory element. The ordinate qualitatively shows a number of memory elements including a threshold value voltage indicated on the abscissa. Memory elements in an unprogrammed state will subsequently be referred to by the binary state 1, whereas memory elements in a programmed state will be referred to by the binary state 0. The binary name of the memory elements may also take place in an alternative manner, for example with state 1 for programmed and with state 0 for unprogrammed memory elements.

Memory elements in a binary state 1 exhibit a threshold voltage with a statistical distribution within a region 12, wherein the threshold voltages included by the region 12 are below a reading voltage 14. The reading voltage 14 is applied to the memory elements by a device, or memory device accessing the memory elements so as to poll the respective state of the memory element. Memory elements in a programmed state include a threshold voltage within a statistical distribution 16, the reading voltage 14 being smaller than the threshold voltages of the statistical distribution 16.

When applying the reading voltage 14 to a respective memory element, memory elements with a threshold voltage within the statistical distribution 12 are recognized to be unprogrammed and memory elements with a threshold voltage within the statistical distribution 16 to be programmed and the stored information are read out. Exposing the memory elements to the ionizing radiation in accordance with step 102 of method 100 or step 202 of method 200 results in a shift in the statistical distribution 16 in the direction of the statistical distribution 12. The arrow 18 indicates that initially this takes place without misrecognitions of individual memory elements, as long as the statistical distribution 16 or all of the threshold voltages of the statistical distribution 16 is/are greater than the reading voltage 14.

Continuing irradiation results in an increase in the radiation dose absorbed by the memory element and a reduced concentration of the charge carriers stored on the respective floating gates. This results in the statistical distribution 16 to be shifted further in the direction of the statistical distribution 12. This decreases the threshold voltage of part of or all of the originally programmed memory elements such that it will be smaller than the reading voltage 14, as is indicated by arrow 22. If a threshold voltage of an originally programmed memory element is reduced to a value below the reading voltage 14, this memory element, despite the originally programmed state, will be identified as being unprogrammed. Adjusting (exemplarily reducing) the reading voltage 14, however, may provide reliable results as long as the region of the statistical distribution 12 is "separated" from the region of the statistical distribution 16 and the reading voltage 14 may be applied between the regions of the statistical distributions 12 and 16.

Data destruction in this case may be identified using a deeper forensic analysis, for example by reducing the reading voltage. The state of the semiconductor component may correspond to that of digital cleaning. With an analog access to the programmed semiconductor components, analog signals which hint at programming of the cells may be read out by increased threshold values, due to potential residual charges on the floating gate. Continued irradiation results in the statistical distributions 12 and 16 to form a common region.

FIG. 3b shows the statistical distributions of the memory element, in analogy to FIG. 3a, after the memory elements have absorbed the target dose. The statistical distribution 16 of the threshold voltages is, based on irradiation, exemplarily based on the triggered ionizing effect, reduced so much that it overlaps the statistical distribution 12 of the unprogrammed cells, and an overlap region 24 is, for example, at least 20%, 30%, 50% or 80% of the respective statistical distribution or the sum of originally programmed and unprogrammed memory elements. A resulting statistical distribution 26 of the threshold voltages of all the memory elements forms a contiguous region. At the position of the region 24, i.e. at the position where the statistical distributions 12 and 16 overlap, the resulting statistical distribution 26 exhibits two local maximums or two humps. Due to forming the common region 24, it may no longer be differentiated securely between programmed and unprogrammed memory elements when changing the reading voltage 14, since applying a reading voltage 14 to the memory elements for separating the statistical regions 12 and 16 is prevented.

Figure 3C:
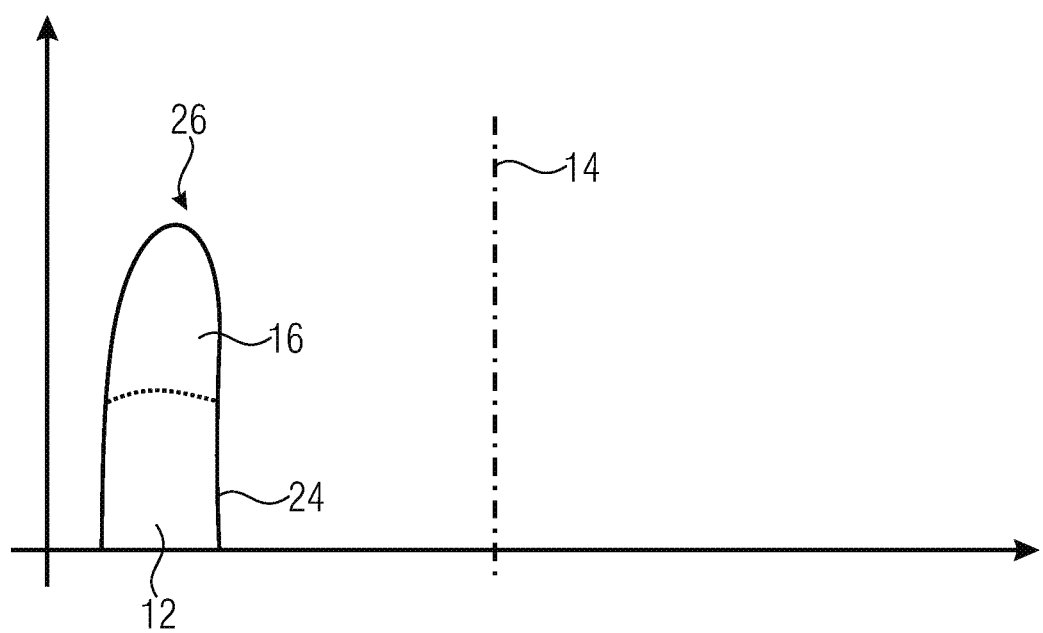

FIG. 3c shows the statistical distribution of the memory elements in accordance with FIGS. 3a and 3b after continued irradiation of the memory elements. The overlap region 24 includes the statistical regions 12 of the originally unprogrammed memory elements and the originally programmed memory elements nearly completely such that the resulting statistical distribution 26 of the memory elements roughly corresponds to a state where all of the memory elements are in an unprogrammed state. In order to achieve, after irradiation, a nearly complete overlap region, a target dose, higher compared to the target dose of FIG. 3b, which is absorbed by the semiconductor component may for example be determined. FIG. 3c shows a state of the memory elements which may be set when the erasing object is irradiated beyond the absorbed target dose for achieving the state illustrated in FIG. 3b.

Alternatively or additionally, a shift of the statistical regions 12 towards higher or lower threshold voltages may also be detectable based on different ionization effects which will be described below referring to FIG. 7. An excess in holes, caused by ionization effects, in insulation materials may exemplarily result in a shift of the statistical region 12 and thus of the resulting statistical distribution 26 towards higher threshold voltages.

Subsequently, a schematic illustration of erasing information in memory elements which, by being present in more than two memory states, may represent a larger quantity of information, for example, MLC memory elements which may take four logic states which may be represented by the bit combinations "11", "10", "01" and "00", will be described.

The influence of irradiation on memory elements of an MLC semiconductor component will be discussed below referring to FIG. 7. FIG. 7 shows a schematic illustration of the effects of ionizing radiation on a flash memory element of a semiconductor component. An effect A of FIG. 7 describes neutralization of charge carriers on the respective floating gate of the respective memory element. Effect B describes charge carriers to be caught in insulation layers which surround the respective floating gate. Catching results in masking of charge carriers stored on the floating gate. Effect C describes photoemission by the charge carriers stored on the respective floating gate being excited by the ionizing radiation.

FIG. 4a shows a statistical distribution 12 of the unprogrammed memory elements and the statistical distributions 16-1, 16-2 and 16-3 of the programmed memory elements which may each be differentiated among one another by the reading voltages 14-1, 14-2 and 14-3. The statistical distributions are equally distributed in the unprogrammed state "11" and the programmed states "10", "01" and "00", for example, wherein the statistical distributions may exhibit any distribution, depending on the data stored.

FIG. 4b schematically shows all of the memory elements being present in the state "11" after having been irradiated such that, after irradiation, it can no longer be deduced from a memory element from the state "11" which state the respective memory element had before being irradiated. After reaching the target dose by irradiation, the memory states of the memory elements are each influenced based on the ionization effect such that the memory states, after the irradiation process, are independent of the memory states before the irradiation process. Due to the destruction of this context, reconstruction of the original data is prevented. The common region 26, relative to the threshold voltages of the memory elements, thus has a width $\Delta V_{SW}$ in which the threshold voltages of the memory elements are distributed. The width $\Delta V_{SW}$ here may be influenced by several factors, such as the quantity or weighting of individual ionization effects occurring during irradiation and being discussed in FIG. 7. When effects A and C occur with a large weighting relative to all of the ionization effects, the width $\Delta V_{SW}$ may be smaller than when effects A and C occur with small weighting. With larger a weighting, nearly all of the charge carriers on the floating gates of the memory elements may be neutralized, such that the memory elements among one another exhibit little deviations with regard to the residual charge carriers, and thus the region of the resulting statistical distribution 26 exhibits a small width $\Delta V_{SW}$. A height X of the resulting statistical distribution 26 may be dependent on the number of memory elements and the width $\Delta V_{SW}$ such that a larger width $\Delta V_{SW}$ may result in a smaller height X and vice versa, wherein an area of the statistical distribution 26 remains constant.

FIG. 4c schematically shows the presence of the threshold voltages of all of the memory elements in the common statistical distribution 26. Effect B discussed in FIG. 7 results in a shift in the statistical distribution 26 towards higher threshold voltages. Compared to negative charges of the charge carriers stored on the floating gate, the holes generated by effect B produce positive charges in the form of holes. An excess in holes may result in a shift of the threshold voltage to be applied.

The resulting statistical distribution 26 may also exhibit a different shape with one or several local maximums, as is illustrated in FIG. 3b. A "formation of humps" may, for example, result during irradiation when the statistical distributions 12, 16-1, 16-2 and 16-3 "migrate" into one another and form the common statistical contribution 26.

In principle, height, width and/or position of the resulting statistical distribution 26 at the axis of the threshold value voltages may vary in dependence on the influence of the individual ionization effects. A dependence of the influence may, for example, be relative to the irradiation method used or the radiation source used. Compared to proton radiation or heavy ion radiation, electron radiation of a corresponding source may, for example, result in a different weighting of the individual effects A, B and/or C.

FIG. 5a shows a schematic setup of a memory element, exemplarily in the form of a metal oxide semiconductor field-effect transistor (MOSFET) which is extended by a floating gate 32 such that the MOSFET, apart from a control gate 34, a source 36 and a drain 38, comprises four conductive components, exemplarily in the form of a respective semiconductor element. The floating gate 32 is insulated relative to the other conducting elements 34, 36 and 38 by insulators 42a and 42b. A small concentration of charge carriers is stored on the floating gate 32 in an unprogrammed state of the memory element such that, in an electrically uncontacted state of the memory element, there is a relatively homogenous potential course over the memory element, as is indicated by the broken line 44.

FIG. 5b shows the schematic illustration of the MOSFET in analogy to FIG. 5a in a programmed state of the memory element, referring to FIG. 6. FIG. 6 shows a schematic illustration of the course of the drain current at an MOSFET relative to a voltage applied at the control gate. Charge carriers 46 are stored on the floating gate 32. These result in a potential offset in the region of the floating gate 32, as is indicated by the course of the broken line 44. The charge carriers 32 result in a shift of the characteristic curve of the drain current relative to a voltage applied at the control gate 28, as is illustrated in FIG. 6.

The floating gate is surrounded completely by insulator material 42a and 42b, thereby explaining the term "floating gate". When, for example, electrons are applied onto the floating gate 32, these shield the electrical field applied at the control gate 34 and the result is a shift in the characteristic curve of the memory element, as is shown in FIG. 6. Introducing the charge carriers 46, exemplarily in the form of electrons, and thus programming the memory elements may, for example, take place such that the electrons jump over a potential barrier of the insulator 42a, 42b, which is referred to as hot-channel injection, and is exemplarily applied in NOR flash memories. Alternatively or additionally, the electrons may tunnel through the potential barrier by means of the so-called Fowler-Nordheim tunneling, as is, for example, applied in NAND flash memories, by applying voltages of suitable height to the memory elements. Erasing the cells electrically generally takes place using the Fowler-Nordheim tunneling. When there is no voltage applied to the memory cell, the charge remains caught in the floating gate, i.e. "stored", until it escapes over minute or minimum leakage currents in the insulator over a period of time of, for example, 10 to 100 years.

FIG. 6 shows a schematic graph with voltage-current curves of an unprogrammed and a programmed memory cell of an MOSFET. The abscissa of the graph shows a control gate voltage applied to a memory cell or memory element. The ordinate of the graph shows the source-drain current as a function of the control gate voltage applied. A characteristic curve 48 of an unprogrammed memory element shows that, when applying the reading voltage 14 at the control gate of the memory element, a source drain current of the memory element may flow. When the reading voltage 14 is applied to a programmed memory element, a characteristic curve 52 of the programmed memory element shows that the reading voltage 14 is smaller than a threshold voltage above which the transistor of the memory element becomes conductive and above which a source-drain current flows. The characteristic curve 48 of the unprogrammed memory element is, with an offset 54, roughly parallel to the characteristic curve 52 of the programmed memory element. The offset 54 corresponds to a difference, representable by a delta relative to the threshold voltage, of the threshold voltages between programmed and unprogrammed memory elements. If a defined reading voltage 14 is applied to the control gate, no current flows between source and drain with a programmed cell, wherein a detectable current flows with a erased cell.

FIG. 7 shows a schematic illustration of the effects of ionizing radiation on a flash memory element of a semiconductor component in a band model. Insulators 42a and 42b separate, as a band gap, the valance bands of the control gate 34, source gate 36 and drain gate 38 from the floating gate 32. With effect A, the ionizing radiation 56 results in charges 58 which penetrate into the floating gate 32 and neutralize charge carriers 46 to be generated in the insulators 42a and 42b surrounding the floating gate 32. With effect B, a charge is generated by the ionizing radiation 56 in the insulators, exemplarily in the form of holes, which exhibit a charge opposite to the charge carriers 46, which is "trapped" there and, with the potential generated, masks part of the charge carriers or the potential of the charge carriers on the floating gate, which may result in part of the charge carriers stored on the floating gate 32 to be neutralized. The influences of effect B may be temporary at least partly or completely. Thus, these influences by heating the memory elements may exemplarily be reduced (healed) at least partly by trapped holes, under the influence of the temperature, recombining with electrons and being neutralized. With effect C, the ionizing radiation 56 energetically excites the charges 46 such that the charges 46 comprise enough energy so as to overcome the potential barrier of the insulator 42a or 42b, and the concentration of the charge carriers 46 in the floating gate 32 decreases. With small thicknesses of the insulation layers 42a and 42b, effect B may be small compared to effects A and C. When all, or nearly all, charge carriers 46 have been removed from the floating gate 32 by effects A and C, or neutralized by effects A to C and, thus, the concentration of the charge carriers on the floating gate is reduced sufficiently, a erasing state which corresponds to an analog deletion or cleaning has been reached.

Figure 8:
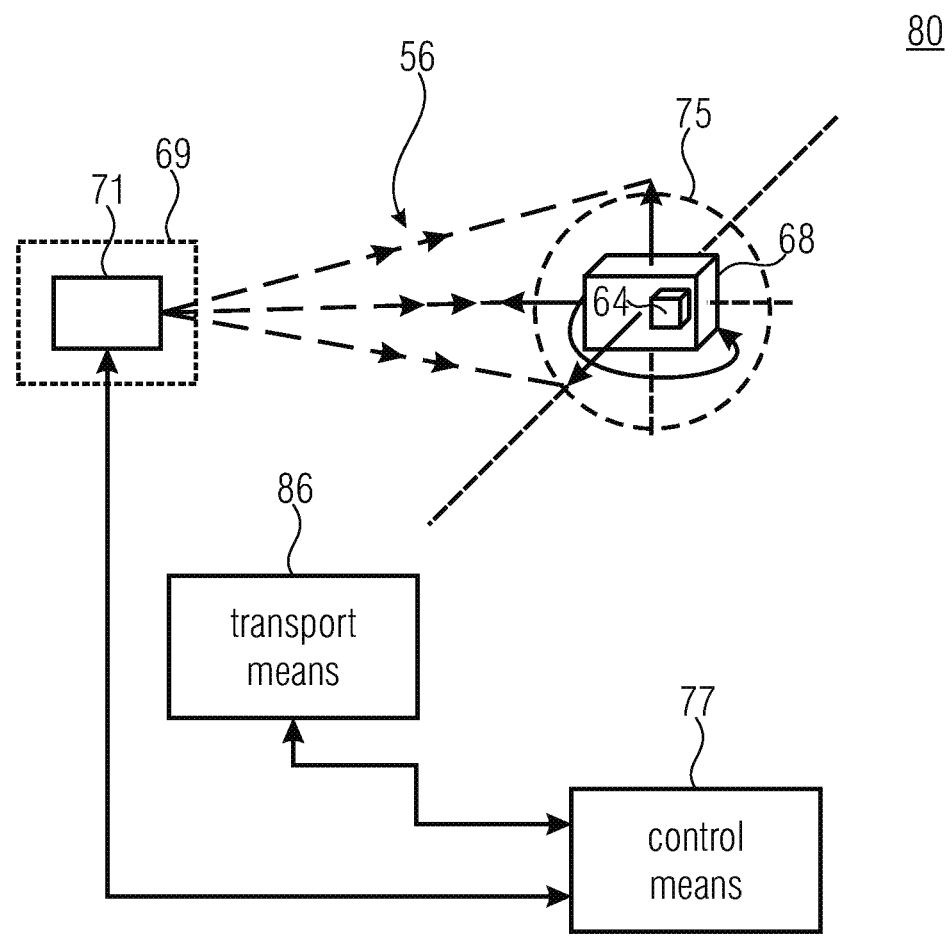
FIG. 8 shows a basic illustration of a device for automatically positioning a semiconductor component arranged in a container.

FIG. 8 shows a basic illustration of a device 80 for automatically positioning a semiconductor component 64 arranged, for example, in a container 68. The erasing device 80 comprises irradiation means 69 with a radiation source 71 for emitting ionizing radiation 56 in order to irradiate an irradiation region 75. In principle, the ionizing radiation may be any type of ionizing radiation, for example photon radiation, electron radiation, neutron radiation, particle radiation, like proton radiation or radiation including heavy ions.

In addition, the device 80 comprises transport means 86 configured to move the semiconductor component 64 or the container 68 from an initial position to a final position at an (average) transport speed relative to the irradiation process. The transport speed may, for example, be constant at least over portions or also be variable over portions. In addition, movement may, for example, also be halted at times so as to stop the semiconductor component 64 or container 68 at an irradiation position chosen. The transport means 86 may, for example, be a conveyor belt on which the semiconductor component 64 is guided past the radiation source 69 and irradiated.

Additionally, the transport means 86 is configured to move or deflect the semiconductor component by a relative movement relative to the radiation source 69. The relative movement may, for example, include turning of the container 68 or a horizontal and/or vertical shift like, for example, using a crane device. Thus, a plurality of semiconductor components 64 to be irradiated in a plurality of containers 68 may be located, for example, on transport means 86 which moves the semiconductor components 68 to be irradiated to the respective erasing region/s. A respective container may be deposited in the erasing region or the transport means 86 may be halted until the target dose has been absorbed by the semiconductor components and these are subsequently moved out from the irradiation region ("stop and go") operation. Alternatively, a container may also be moved through the irradiation region in continuous operation at a constant or variable transport speed.

The container may be turned in front of the radiation source 69 in order to reduce absorption "shadows", maybe present, of the ionizing radiation or the erasing radiation 56 in the respective container 68 and achieve complete penetration of the semiconductor components with the erasing radiation 56. Alternatively, the transport means 86 may, for example, include a gripper arm which is arranged to be movable at a rail system and is configured to grip the container 68 and move same past the radiation source 69 at the transport speed and turn same in front of the radiation source 69 using the relative movement (i.e. deflect at least in a spatial axis).

Alternatively or additionally, the container 68 may also be guided past the radiation source 69 on the transport means 86 at the transport speed, in order to expose the semiconductor components to continuous radiation.

If semiconductor component 64 or the container 68 is guided through the irradiation region 75, the transport speed may be set such that a time necessitated for passing through the erasing region is at least so long that the semiconductor component absorbs the target dose of ionizing radiation 56.

Alternatively, the container 68 may also be deposited in the irradiation region 75 and be moved out from the irradiation region 75 after an irradiation time during which the container 68 or semiconductor component 64 is irradiated with ionizing radiation 56 and after which the target dose has been absorbed. Alternatively or additionally, a container 68 may, for example, be turned by the transport means 86 and subsequently be exposed to the ionizing radiation 56 until part of the target dose has been absorbed by the semiconductor component 64. After the part of the target dose has been absorbed, the container 68 may be turned further or moved in order to be irradiated afterwards at a different angle or a different orientation relative to the radiation source 69 and absorb another part of the target dose. Alternatively or additionally, the container 68 may also be exposed to the ionizing radiation 56 during moving or turning.

Control means 77 is configured to control the transport means 86 and the radiation source 69. Thus, the control means 77 may, for example, adjust the transport speed and/or a turning speed at which the relative movement takes place, in dependence on the respective erasing object with the semiconductor component 64 to be erased, in order to achieve absorption of the respective target dose with constant radiation intensity of the erasing radiation 56 and varying absorption degrees of the erasing objects with varying transport speeds or varying duration during which the erasing object is deposited in the erasing region.

A continuous erasing process may be executed using the device 80, meaning that a plurality of containers 68 may be deposited on the transport means 86 and be irradiated one after the other.

Figure 9:
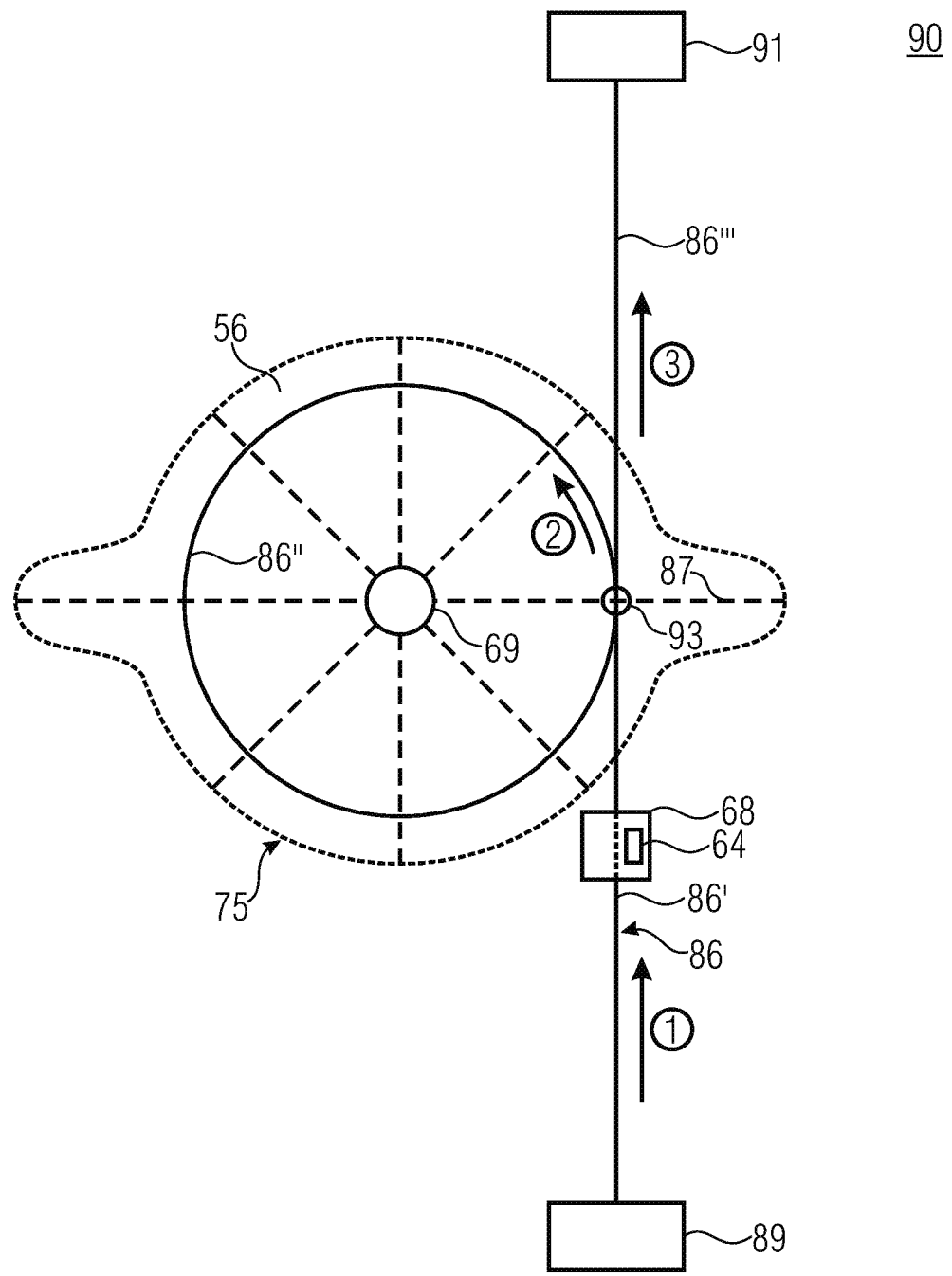
FIG. 9 shows a schematic illustration of a device for erasing information stored on an electronic semiconductor component.

FIG. 9 shows a schematic top view of a device 90 for irradiating a semiconductor component 64 using the radiation source 69 which exemplarily emits the ionizing radiation 56 in an irradiation plane and irradiates the irradiation region 75. The ionizing radiation 56 emitted comprises a preferential direction 87 in the irradiation plane where an intensity of the ionizing radiation 56 is larger than in other directions such that the effective radiation region 75 (relative to the selectable distance of the radiation source 69 to the semiconductor component 64) is enlarged in the preferential direction 87 (x direction). The device 90 comprises transport means 86 with a first portion 86', a second portion 86" and a third portion 86'". Around the coupling position 93, the portion 86' and 86'" are partly, i.e. in sections, arranged within the irradiation region 75 such that the portions 86' and 86'" are partially exposed to the ionizing radiation 56. A semiconductor component which is moved or positioned in the sections exposed to the ionizing radiation 56 may absorb part of the radiation 56. The transport means 86 is configured to move the semiconductor component 64 or container 68 with the semiconductor component 64 from the initial position or the acceptance region 89, for example delivery zone, to the final position or transfer region 91, for example a transfer zone of the device 90, along the portions 86', 86'" and, maybe, 86". During movement within the irradiation region 75, the semiconductor component 64 absorbs the target dose, for example by the semiconductor component 64 being moved around the radiation source 69 in the portion 86". Alternatively, the semiconductor component 64 may be guided past the radiation source 69 in the sections of portions 86' and 86" where the semiconductor component is exposed to the ionizing radiation 56 and absorb the target dose.

The transport means 86 is, for example, implemented as a rail system and configured to move, in a first phase 1, the container 68 from the initial region 89 towards the radiation source 69. The semiconductor component 64 is exposed to the ionizing radiation 56 within the irradiation region 75 which is influenced by the preferential direction 87. A coupling-out position 93, for example a track switch of the transport means 86', is configured to guide the container 68 to the portion 86", if applicable. In a second, option phase 2, the semiconductor component 64 is moved around the radiation source 69 in the portion 86" until the target dose has nearly or completely been absorbed by the semiconductor component 64. The speed of the semiconductor component 64 on the portion 86" or a number of rounds of the semiconductor component 64 relative to the radiation source 69 in the portion 86" may, for example, be varied here. In phase 3 which follows phase 1 or, if applicable, the optional phase 2, the semiconductor component 64 is directed to the portion 86''' at the coupling-out position 93, and moved out from the irradiation region 75 towards the final region 91 such that the target dose has been absorbed when reaching the final region 91.

The transport means 86 may be configured such that the semiconductor component 64 in the portion 86" is moved at a speed varying over time and/or remains unmoved at certain positions and/or at times. Alternatively or additionally, the transport means 86 may be configured such that the semiconductor component 64 is moved past the radiation source 69 or around the radiation source 69 at a constant speed.

The device 90 allows irradiating containers or semiconductor components or erasing objects at varying target doses to be absorbed. Thus, a container 68 may exemplarily, in phase 2, be guided around the radiation source 69 once in portion 86" in order to absorb a first target dose. In phase 2, a following container 68 may be guided around the radiation source 69 twice or several times, for example due to a larger number of erasing objects in the container, in order to absorb a second target dose. A further container may, for example, pass only phases 1 and 3 since a third target dose has already been absorbed by the semiconductor component while moving the container along the portions 86" and 86".

For guiding a container 68 around the radiation source 69 once or several times, the portion 86" and/or the portions 86' or 86''' may include several planes or levels. For example, it is conceivable for the transport means 86 to comprise a first and a second level, wherein the portion 86' is arranged in the first level and the portion 86''' in the second level. The copying position 93 is configured to couple out a container 68 from the portion 86' when first arriving there such that the container 68 is guided around the radiation source 69 in a first direction on the first level. The coupling position 93 is also configured to move the container 86 to the second level, for example using a lift, in the case of a second arrival which follows the first arrival such that the container 68 is guided around the radiation source 69 in a second direction which is opposite to the first direction, for example. The coupling position 93 is, for example, also configured to move the container 68 back to the first level in the case of a third arrival at the coupling position 93 in order to guide the container around the radiation source 69 again and repeat the steps having been performed after first reaching the coupling position 93 or to move the container to the portion 86''' at a third arrival when the target dose necessitated has been absorbed.

Generally, the transport means 86 may comprise any number of levels, for example one, two or several levels.

The device may optionally include an absorber sink which comprises an absorber material, for example, water, and is arranged to be neighboring to the radiation source. The device is, for example, configured to move the radiation source, for example while shutting down for maintenance purposes, to the absorber sink and to be covered or enclosed by the absorber material such that the irradiation region is reduced considerably or arranged within the absorber sink.

As an alternative to the rail system, the transport means 86 may also comprise another transport system, for example a movable crane.

Alternatively, it is also feasible for the radiation source 69 not to comprise a preferential direction or to comprise several, for example two preferential directions 87. When the radiation source 69 does not have a preferential direction 87, the radiation source 69 will irradiate a round or roughly round region. Several preferential directions 87 may, for example, be used such that semiconductor components 64 or containers 68 to be irradiated are temporarily slowed down or halted on transport means 86 relative to the radiation source 69 at locations in one preferential direction each. This may allow a larger absorption of a dose of the ionizing radiation 56 at these locations and, for example, reduce a number of passes through phase 2 such that an increase as to the throughput of erasing object to be irradiated by the device 19 may be achieved. No preferential direction means that the irradiation region 75 is implemented to be circular or concentric and that the radiation dose can be absorbed continually by the semiconductor component.

Figure 10:
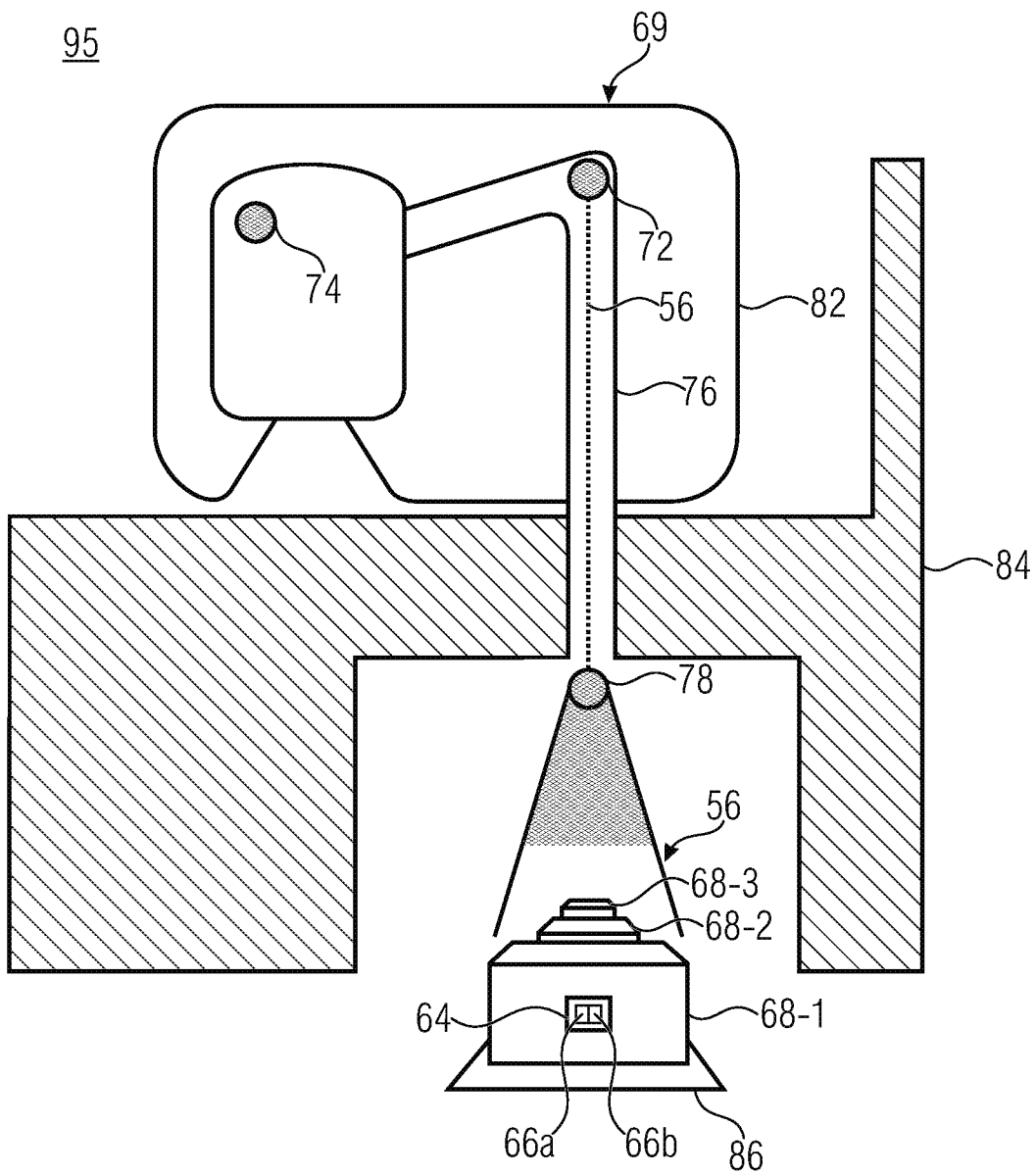
FIG. 10 shows a schematic top view of an alternative device for erasing information on electronic semiconductor memories.

FIG. 10 shows a schematic illustration of a device 95 for erasing information stored on an electronic semiconductor component comprising a plurality of non-volatile memory elements. The device 95 includes irradiating means or a radiation source 69 configured to irradiate a semiconductor component 64. The semiconductor component 64 includes a plurality of memory elements 66a and 66b. The memory component 64 is arranged in a container 68-1 which is transparent for the ionizing radiation 56 such that the target dose of the ionizing radiation 56 is absorbed by the semiconductor component 64 during irradiation. The irradiation source 69 here exemplarily is configured to irradiate the semiconductor component 64 with electron radiation. At a cathode 72, when applying a high voltage generated by a high-voltage generator 74, electrons are accelerated over an accelerator tube 76. A scanner 78 of the device 95 is configured to redirect the electrons emitted from the cathode 72. The cathode 72 and the accelerator tube 76 thus are arranged in a pressure tank 82 configured to shield the ionizing radiation 56 in the form of electrons. The radiation source 69 is from a region where the semiconductor component 64 is irradiated, by a shield 84, exemplarily in the form of a concrete structure. The ionizing radiation 56 may penetrate the container 68-1 and the semiconductor component 64, wherein the ionization effects described before occur such that charges on the semiconductor component 64 are reduced by the ionizing radiation 56 and data or information are erased.

The scanner 78 is configured to redirect the ionizing radiation 56. Thus, the semiconductor component 64 may be irradiated with the ionizing radiation 56 from different angles. Thus, regions of the semiconductor component 64 which are irradiated with a smaller part of the ionizing radiation 56 due to temporary shielding effects, may additionally be irradiated from another direction in order to absorb the target dose. Exemplarily, several semiconductor components 64, memory devices or systems may be arranged in the container 68-1 such that a radiation intensity of the ionizing radiation 56 decreases in a radiating direction of the ionizing radiation 56, in particular when several semiconductor components 64 are penetrated by the radiation 56 along the radiation direction. Irradiation of the semiconductor components downstream in the radiation direction from another direction may thus result in an optimized absorption of the radiation dose. The container 68-1 is arranged on transport means 86, exemplarily a conveyor belt, configured to guide the container 68-1 and systems, memory devices and/or semiconductor components arranged therein past the ionizing radiation 56. Further containers 68-2 and 68-3 are arranged on the transport means 86 such that several containers 68-1, 68-2 and 68-3 may be irradiated by the device 95 one after the other and a continuous erasing process may be realized.

Alternatively or additionally, the containers 68-1, 68-2 and 68-3 may be turned on the conveyor belt 86 in order to allow an additional variation of the irradiation direction and irradiation angle.

Alternatively or additionally, automatic positioning of the containers 68-1, 68-2 or 68-3 relative to the irradiation means 69, i.e. relative to the radiation source, may also be done by the transport means 86. Positioning may, for example, take place based on an input of an operator of the unit or be predefined such that the unit is configured to perform automatic positioning of the containers 68-1, 68-2 or 68-3. Automatic positioning or positioning determined by a user input may, for example, be used to set, with changing contents of different containers, a suitable scattering of the radiation or a suitable distance between the radiation source and the semiconductor components to be irradiated.

Alternative embodiments show irradiating means configured to irradiate the semiconductor component with photon radiation, neutron radiation, proton radiation or heavy ion radiation. Different types of radiation exhibit different advantages as regards costs, irradiation energy or penetration performance. Photon radiation may, for example, be generated by transitions of excited atomic nuclei or by slowing down charged particles, for example x-rays. Photons may represent indirectly ionizing radiation with high penetration. Energies of photon radiation may be between 200 keV and 1500 keV, between 300 keV and 1500 keV, between 1000 keV and 1500 keV, between 600 keV and 1400 keV or between 1000 keV and 8000 keV. Units for generating photon radiation may be realized at relatively low costs.

Electron radiation may be generated by a particle accelerator. Electron radiation represents directly ionizing radiation of medium penetration performance, wherein energies of the electron radiation may, for example, be at least 100 keV up to 10000 keV, between 1000 and 8000, between 3000 and 6000 keV or between 4000 keV and 5000 keV. Electron radiation may be generated at low costs.

Proton radiation may be generated by a particle accelerator and represents directly ionizing radiation of low penetration performance. Proton radiation may comprise energies of, for example, at least 10 keV up to 600 MeV, between 1 MeV and 600 MeV or between 100 MeV and 500 MeV, wherein devices for generating proton radiation, compared to other types of radiation, may be expensive. Materials irradiated with proton radiation may become radioactive by the irradiation, which may result in the materials irradiated to remain in the irradiation unit for a longer up to indefinite period of time.

Neutron radiation may, in analogy to proton radiation, be generated in a particle accelerator or, alternatively, in nuclear reactors and represents indirectly ionizing radiation of high penetration performance. The devices for generating neutron radiation may, compared to other types of radiation, be expensive. Typical energies of neutron radiation may, for example, be at a few up to several 100 MeV, between 10 MeV and 100 MeV or between 40 MeV and 80 MeV, wherein the materials irradiated, in analogy to proton radiation, may become radioactive, which may result in the materials to remain in the irradiation device for a longer up to indefinite period of time.

Radiation consisting of heavy ions, so-called heavy ions, may be generated in a particle accelerator and comprises a very small penetration performance, wherein an energy range usable for the method may, for example, be at several 100 up to 1000 MeV, between 200 MeV and 800 MeV, 400 MeV and 700 MeV or 500 MeV to 600 MeV. Compared to other types of radiation, a unit for generating heavy ion radiation may be very expensive.

All in all, all of the types of radiation described above may be usable for the methods described here, depending on the respective elements to be irradiated.

Commercial irradiation means offering electron accelerators or cobalt-60 (Co-60) for sterilization and material processing may potentially be used for a method of erasing information and data. Thus, generally Co-60 offers a smaller dose rate at high penetration, whereas electrons offer a high dose rate at low penetration.

Figure 11:
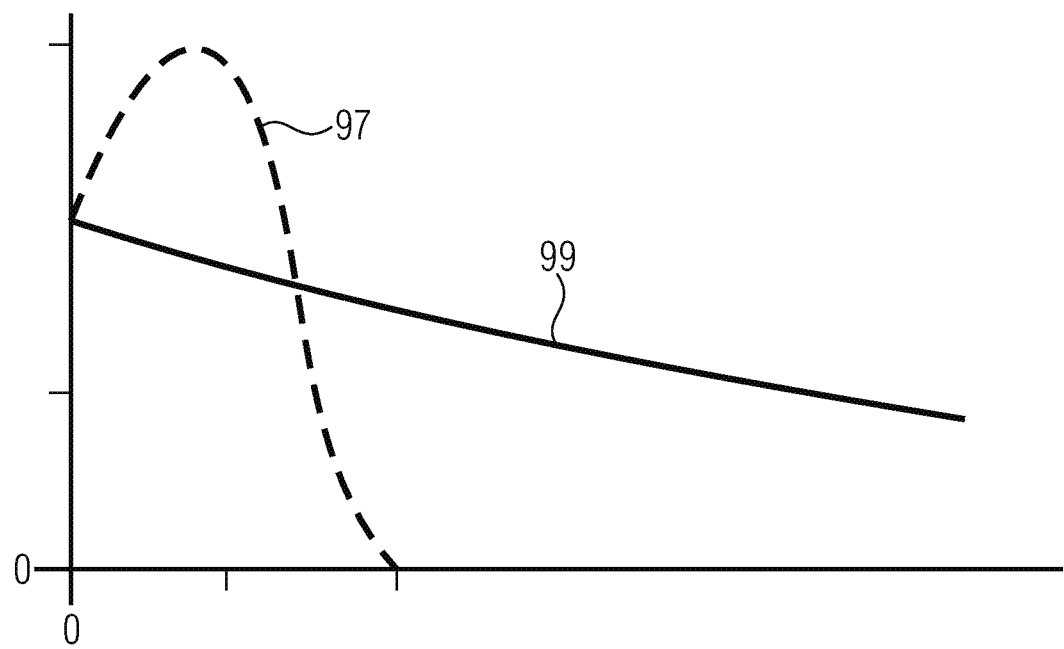
FIG. 11 shows a schematic comparison of electron radiation with a radiation energy of 5 MeV and Co-60 radiation.

FIG. 11 shows a schematic comparison of electron radiation with a radiation energy of 5 MeV, represented in the broken line 97, compared to Co-60 radiation forming γ radiation and represented by a continuous line 99. An abscissa of the graph indicates a surface weight of objects to be irradiated. The ordinate represents the dose of the respective radiation in percent proportionally, i.e. relatively. With a surface weight close to zero, i.e. with objects of very low density, electron radiation and gamma radiation 97 and 99 exhibit a relative penetrability of 100%, or release a dose of 100% to the object irradiated. Curve 97 of the electron radiation increases with an increasing surface weight until a value of roughly 150% of the dose has been reached, and afterwards decreases quickly with an increasing surface weight to a dose of 0%. Curve 99 of the gamma radiation, in contrast, exhibits a continuous decrease of the dose with an increasing surface weight, hinting at a low penetration performance.

Alternative embodiments show an irradiation unit using gamma radiation, as is employed commercially. Such a unit may be used for a method of erasing information on semiconductor components. Erasing objects to be irradiated, for example memory devices, semiconductor components or systems, may be stacked on pallets and/or be surrounded by a sealed cage and thus moved around the Co-60 source. In order to ensure high to optimum homogeneity of the radiation impact, the pallet may be turned and be irradiated from several sides. The irradiation time may be selected such that the apparatuses within the containers absorb a target dose necessitated, exemplarily 1 kGy, 5 kGy, 10 kGy, 15 kGy, 20 kGy or 25 kGy, while they are moved around the radiation source. Thus, the reached dose may, for example, be verified by a suitable indicator element or dosimeter. In contrast to sterilization applications, a method executed using the device does not require a maximum dose limit, which means that a dose of any height may be absorbed, for example, by devices arranged within a container towards the outside, since only a target dose with a meaning of a minimum dose to be absorbed is defined for each apparatus. Until this target dose has been absorbed by an apparatus in the center of the container, a higher dose may be absorbed by an apparatus which, relative to the center of the container, is further outside.

Due to the low penetration and the high dose rate of up to 10 MGy/h, in electron accelerators, generally transport means, such as, for example, a conveyor belt arrangement, may be used. Due to the small penetration, it may be of advantage to implement the containers to be thin, maybe only as high as the apparatuses, and to seal them. The sealed packages may then be moved through on a conveyor belt under the electron radiation extended, for example, by means of a scanner. If a package is turned and is irradiated from a different side also, with a 10 MeV electron ray and a density of the apparatuses of 1.4 g/cm³, the result would be a process thickness of roughly 5.8 cm.

In other words, units which, up to now, may exemplarily have been used for the sterilization of medical products or food or cross-linking of plastics, may be used or modified for the purpose of this method.

Although floating gates in memory elements and apparatuses onto which negative charge carriers are stored in order to represent information or data have been described in the above embodiments, other, for example positive, charge carriers may be stored on the floating gates for representing information or data. Erasing charge carriers on the floating gate will then include reducing positive charge carriers and the concentrations thereof on the floating gate, for example. The above description is thus applicable correspondingly.

Although some aspects have been described in connection with a device, it is to be understood that these aspects also represent a description of the corresponding method such that a block or element of a device is to be understood also to be a corresponding method step or feature of a method step. In analogy, aspects having been described in connection with or as a method step also represent a description of a corresponding block or detail or feature of a corresponding device.

Other embodiments include the computer program for performing one of the methods described herein, wherein the computer program is stored on a machine-readable carrier.

In other words, an embodiment of the inventive method is a computer program comprising program code for performing one of the methods described herein when the computer program runs on a computer. Another embodiment of the inventive method thus is a data carrier (or a digital storage medium or a computer-readable medium) onto which is recorded the computer program for performing one of the methods described herein.

Another embodiment includes processing means, for example a computer or a programmable logic device, configured to adapted to perform one of the methods described herein.

Another embodiment includes a computer onto which is installed the computer program for performing one of the methods described herein.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method of erasing information stored on an electronic semiconductor component in a plurality of non-volatile memory elements, comprising:
   irradiating the semiconductor component with erasing radiation until a target dose of the erasing radiation has been absorbed by the semiconductor component;
   wherein the erasing radiation penetrates the semiconductor component and at least part of the erasing radiation is absorbed in the semiconductor component with an ionization effect occurring, wherein, when the target dose is reached, the concentration of charge carriers stored on the memory elements is influenced by the ionization effect such that the statistical distribution of the threshold voltages of the memory elements forms a contiguous region;
   wherein the target dose of the erasing radiation is selected such that the statistical distribution permanently and irreversibly forms the contiguous region; and
   wherein the concentration of the charge carriers on the memory elements is changed by the ionization effect such that the concentration of charge carriers on the memory elements after the irradiation process is independent of the concentration of the charge carriers before the irradiating process.

2. The method in accordance with claim 1, wherein the target dose of the erasing radiation is selected such that the memory states after the irradiation process are influenced permanently.

3. The method in accordance with claim 1, further comprising:
   detecting the target dose for irradiating based on a material density and the number of semiconductor components to be irradiated simultaneously.

4. The method in accordance with claim 1, wherein irradiating comprises several individual steps in order to achieve the target dose in steps.

5. The method in accordance with claim 3, wherein the target dose is at least 1 kGy.

6. The method in accordance with claim 1, wherein the contiguous region of the statistical distribution of the threshold voltage comprises an overlap region of at least 30% relative to an original first and second logic state.

7. The method in accordance with claim 1, further comprising:
   irradiating an indicator element together with the semiconductor component, wherein the indicator element is configured to change a physical or chemical characteristic when reaching the target dose.

8. The method in accordance with claim 1, wherein the semiconductor component is located in a container transparent for the erasing radiation, and wherein in irradiating the container with the semiconductor component arranged therein is exposed to the erasing radiation.

9. The method in accordance with claim 8, wherein a plurality of semiconductor components or units comprising the semiconductor components are located in the container.

10. The method in accordance with claim 1, wherein irradiating is performed at different incident angles of the erasing radiation onto the semiconductor component.

11. The method in accordance with claim 1, further comprising:
   moving the semiconductor component relative to a radiation source into a radiation region by means of a transporter, wherein the semiconductor component is kept in the irradiation region until the target dose has been absorbed by the semiconductor component.

12. The method in accordance with claim 1, wherein irradiating is performed using photon radiation.

13. The method in accordance with claim 1, wherein irradiating is performed using electron radiation.

14. The method in accordance with claim 1, wherein irradiating is performed using neutron radiation.

15. The method in accordance with claim 1, wherein irradiating is performed using particle radiation.

16. The method in accordance with claim 15, wherein irradiating is performed using proton radiation or radiation comprising heavy ions.

17. The method in accordance with claim 1, wherein the memory elements are implemented to be flash memory elements and comprise a floating gate and an insulating material surrounding the floating gate, wherein an electrical charge stored on the floating gate predetermines any of the possible logic memory states of the respective memory element.

18. A device for erasing information stored on an electronic semiconductor component in a plurality of non-volatile memory elements, comprising:
an irradiator configured to expose the semiconductor component to erasing radiation until a target dose has been absorbed by the semiconductor component;
wherein the erasing radiation penetrates the semiconductor component and at least part of the erasing radiation is absorbed in the semiconductor component with an ionization effect occurring, wherein the ionization effect influences the quantity of charge carriers stored on the memory elements such that the statistical distribution of the threshold voltages forms a contiguous region;
wherein the target dose of the erasing radiation is selected such that the statistical distribution permanently and irreversibly forms the contiguous region; and
wherein the concentration of the charge carriers on the memory elements is changed by the ionization effect such that the concentration of charge carriers on the memory elements after the irradiation process is independent of the concentration of the charge carriers before the irradiating process.

19. The device in accordance with claim 18, wherein the irradiator is additionally configured to irradiate a container transparent for the erasing radiation in which the semiconductor component is located such that the container with the semiconductor components arranged therein is exposed to the erasing radiation.

20. The device in accordance with claim 18, wherein the irradiator is additionally configured to irradiate the semiconductor component with the erasing radiation at different incident angles.

21. The device in accordance with claim 18, which is additionally configured to position the semiconductor component relative to the irradiator based on a user input or based on a predetermined position.

22. The device in accordance with claim 18, wherein the irradiator is configured to irradiate the semiconductor component with photon radiation or electron radiation or neutron radiation or proton radiation or radiation comprising heavy ions.

23. The device in accordance with claim 18, further comprising a transporter configured to move the semiconductor component relative to a radiation source into an irradiation region by means of the transporter and to keep the semiconductor component in the irradiating region until the target dose has been absorbed by the semiconductor component.

24. A device for erasing information stored on an electronic semiconductor component in a plurality of non-volatile memory elements, comprising:
an irradiator configured to expose the semiconductor component to erasing radiation until a target dose has been absorbed by the semiconductor component;
wherein the erasing radiation penetrates the semiconductor component and at least part of the erasing radiation is absorbed in the semiconductor component with an ionization effect occurring, wherein the ionization effect influences the quantity of charge carriers stored on the memory elements such that the statistical distribution of the threshold voltages forms a contiguous region;
wherein the irradiator is additionally configured to irradiate a container transparent for the erasing radiation in which the semiconductor component is located such that the container with the semiconductor components arranged therein is exposed to the erasing radiation; and
wherein the irradiator is additionally configured to irradiate the semiconductor component with the erasing radiation at different incident angles.

25. A device comprising an irreversibly erased semiconductor component having been erased using a erasing method in accordance with claim 1.

* * * * *